(12) United States Patent
Rice et al.

(10) Patent No.: US 7,611,318 B2
(45) Date of Patent: Nov. 3, 2009

(54) OVERHEAD TRANSFER FLANGE AND SUPPORT FOR SUSPENDING A SUBSTRATE CARRIER

(75) Inventors: Michael R. Rice, Pleasanton, CA (US); Martin R. Elliott, Round Rock, TX (US); Robert B. Lowrance, Los Gatos, CA (US); Jeffrey C. Hudgens, San Francisco, CA (US); Eric A. Englhardt, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/764,820

(22) Filed: Jan. 26, 2004

(65) Prior Publication Data

US 2005/0040662 A1 Feb. 24, 2005

Related U.S. Application Data

(60) Provisional application No. 60/443,153, filed on Jan. 27, 2003.

(51) Int. Cl.
*B65G 17/02* (2006.01)
(52) U.S. Cl. .................................. 414/217.1; 198/678.1
(58) Field of Classification Search ................. 414/626, 414/940, 935, 217, 217.1; 294/92, 1.1, 119.1; 403/409.1, 331, 334–335, 381; 248/220.21, 248/222.13; 198/678.1
See application file for complete search history.

(56) References Cited

U.S. PATENT DOCUMENTS

| | | | | |
|---|---|---|---|---|
| 146,207 | A * | 1/1874 | Schneider | 403/293 |
| 1,182,610 | A * | 5/1916 | Wiesman | 403/318 |
| 2,008,087 | A * | 7/1935 | Stromberg | 403/189 |
| 2,078,848 | A * | 4/1937 | Greger | 294/86.4 |
| 2,588,009 | A * | 3/1952 | Jones | 248/489 |
| 2,656,688 | A | 10/1953 | Hinkel | |
| 2,732,159 | A * | 1/1956 | Connors et al. | 248/224.51 |
| 2,847,243 | A * | 8/1958 | Hare | 294/16 |
| 2,897,928 | A * | 8/1959 | Selig | 403/381 |
| 3,006,679 | A * | 10/1961 | Gray | 294/92 |
| 3,589,758 | A * | 6/1971 | King | 52/584.1 |

(Continued)

FOREIGN PATENT DOCUMENTS

DE 3703609 A1 * 8/1988

(Continued)

OTHER PUBLICATIONS

Weiss, Mitchell, "Evaluating 300-mm Fab Automation Technology Options and Selection Criteria", Jun. 1997, MICRO, vol. 15, No. 6, pp. 65-66, 68, 70, 72, 74, 76, 78-79.

(Continued)

*Primary Examiner*—Charles A Fox
(74) *Attorney, Agent, or Firm*—Dugan & Dugan, PC

(57) ABSTRACT

In a first aspect, a first apparatus is provided for use in supporting a substrate carrier. The first apparatus includes an overhead transfer flange adapted to couple to a substrate carrier body and an overhead carrier support. The overhead transfer flange has a first side and a second side opposite the first side that is wider than the first side. Numerous other aspects are provided.

6 Claims, 13 Drawing Sheets

U.S. PATENT DOCUMENTS

| | | | |
|---|---|---|---|
| 3,710,921 A | 1/1973 | Petiet | |
| 3,710,923 A | 1/1973 | Fromme et al. | |
| 3,722,656 A | 3/1973 | Loomis, Jr. et al. | |
| 3,734,263 A | 5/1973 | Dirks | |
| 3,815,723 A | 6/1974 | Wright et al. | |
| 3,885,825 A * | 5/1975 | Amberg et al. | 294/115 |
| 3,901,376 A | 8/1975 | Dardaine et al. | |
| 3,921,796 A | 11/1975 | Bok et al. | |
| 3,990,569 A | 11/1976 | Aiuola | |
| 4,029,194 A | 6/1977 | Feurstein et al. | |
| 4,033,403 A | 7/1977 | Seaton et al. | |
| 4,040,302 A | 8/1977 | Katarao | |
| 4,044,886 A | 8/1977 | Sender | |
| 4,261,236 A | 4/1981 | Verjux | |
| 4,266,652 A | 5/1981 | Bald | |
| 4,340,137 A | 7/1982 | Foster | |
| 4,344,363 A | 8/1982 | Veith | |
| 4,401,522 A | 8/1983 | Buschow et al. | |
| 4,450,950 A | 5/1984 | Foote, Jr. | |
| 4,506,779 A | 3/1985 | Seragnoli | |
| 4,524,858 A | 6/1985 | Maxey | |
| 4,534,843 A | 8/1985 | Hirbour et al. | |
| 4,540,088 A | 9/1985 | Bergh | |
| 4,549,647 A | 10/1985 | Cosse | |
| 4,584,045 A | 4/1986 | Richards | |
| 4,585,126 A | 4/1986 | Paddock et al. | |
| 4,603,770 A | 8/1986 | Hartness | |
| 4,650,264 A | 3/1987 | Dahnert | |
| 4,667,809 A | 5/1987 | Raybuck | |
| 4,680,919 A | 7/1987 | Hirama et al. | |
| 4,684,285 A | 8/1987 | Cable | |
| 4,693,359 A | 9/1987 | Mattei et al. | |
| 4,754,884 A | 7/1988 | Schonenberger | |
| 4,759,439 A | 7/1988 | Hartlepp | |
| 4,765,453 A | 8/1988 | Bucher | |
| 4,775,046 A | 10/1988 | Gramarossa et al. | |
| 4,813,528 A | 3/1989 | Hartlepp | |
| 4,830,180 A | 5/1989 | Ferguson et al. | |
| 4,831,962 A | 5/1989 | Gros | |
| 4,850,102 A | 7/1989 | Hironaka et al. | |
| 4,854,440 A | 8/1989 | Laube et al. | |
| 4,858,869 A * | 8/1989 | Stang | 248/311.2 |
| 4,869,637 A | 9/1989 | deGroot | |
| 4,877,123 A | 10/1989 | Fukuwatari et al. | |
| 4,898,373 A | 2/1990 | Newsome | |
| 4,936,222 A | 6/1990 | Murai | |
| 4,991,360 A | 2/1991 | DeSpain | |
| 5,035,389 A * | 7/1991 | Wang | 248/224.51 |
| 5,048,164 A | 9/1991 | Harima | |
| 5,082,192 A | 1/1992 | Langen et al. | |
| 5,086,909 A | 2/1992 | Powell, Jr. | |
| 5,086,958 A * | 2/1992 | Nagy | 224/544 |
| 5,099,896 A | 3/1992 | Ritola | |
| 5,110,249 A | 5/1992 | Norman | |
| 5,113,992 A | 5/1992 | Sadamori | |
| 5,123,518 A | 6/1992 | Pfaff | |
| 5,123,804 A * | 6/1992 | Ishii et al. | 414/680 |
| 5,135,102 A | 8/1992 | Sjogren et al. | |
| 5,184,712 A | 2/1993 | Leypold et al. | |
| 5,207,309 A | 5/1993 | Simpkin et al. | |
| 5,226,211 A | 7/1993 | Jones | |
| 5,231,926 A | 8/1993 | Williams et al. | |
| 5,242,045 A | 9/1993 | Kakida et al. | |
| 5,261,935 A | 11/1993 | Ishii et al. | |
| 5,269,119 A | 12/1993 | Tolson | |
| 5,275,275 A | 1/1994 | Boldrini et al. | |
| 5,316,126 A | 5/1994 | Hirai | |
| 5,382,127 A | 1/1995 | Garric et al. | |
| 5,388,945 A | 2/1995 | Garric et al. | |
| 5,390,785 A | 2/1995 | Garric et al. | |
| 5,411,358 A | 5/1995 | Garric et al. | |
| 5,439,091 A | 8/1995 | Mason | |
| 5,481,829 A | 1/1996 | Waytashek | |
| 5,549,205 A | 8/1996 | Doche | |
| 5,558,198 A | 9/1996 | Juarez | |
| 5,603,777 A | 2/1997 | Ohashi | |
| 5,617,944 A | 4/1997 | McTaggart | |
| 5,628,614 A | 5/1997 | Pazdernik et al. | |
| 5,653,327 A | 8/1997 | Buday, Jr. et al. | |
| 5,664,337 A | 9/1997 | Davis et al. | |
| 5,667,056 A | 9/1997 | Kimmet | |
| 5,674,123 A | 10/1997 | Roberson, Jr. et al. | |
| 5,762,544 A | 6/1998 | Zuniga et al. | 451/285 |
| 5,772,386 A | 6/1998 | Mages et al. | |
| 5,788,458 A * | 8/1998 | Bonora et al. | 414/811 |
| 5,823,319 A | 10/1998 | Resnick et al. | |
| 5,827,118 A | 10/1998 | Johnson et al. | |
| 5,829,939 A | 11/1998 | Iwai et al. | |
| 5,884,392 A | 3/1999 | Lafond | |
| 5,941,678 A | 8/1999 | Saito | |
| 5,955,857 A | 9/1999 | Kwon et al. | |
| 5,976,199 A | 11/1999 | Wu et al. | |
| 5,980,183 A | 11/1999 | Fosnight | |
| 6,000,900 A | 12/1999 | Isogai | |
| 6,026,561 A | 2/2000 | Lafond | |
| 6,036,426 A | 3/2000 | Hillman | |
| 6,054,181 A | 4/2000 | Nanbu et al. | |
| 6,082,951 A | 7/2000 | Nering | |
| 6,092,979 A | 7/2000 | Miselli | |
| 6,098,941 A * | 8/2000 | Gates et al. | 248/224.51 |
| 6,105,782 A * | 8/2000 | Fujimori et al. | 206/710 |
| 6,120,229 A | 9/2000 | Hofmeister | |
| 6,183,186 B1 | 2/2001 | Peltola et al. | |
| 6,186,331 B1 | 2/2001 | Kinpara | |
| 6,220,953 B1 | 4/2001 | Cornelissen et al. | |
| 6,223,887 B1 | 5/2001 | Andou | |
| 6,227,345 B1 | 5/2001 | Miyamoto | |
| 6,235,634 B1 | 5/2001 | White et al. | |
| 6,244,812 B1 | 6/2001 | Patterson et al. | |
| 6,280,134 B1 | 8/2001 | Nering | |
| 6,283,692 B1 | 9/2001 | Perlov et al. | |
| 6,336,567 B1 | 1/2002 | Hyobu | |
| 6,378,440 B1 | 4/2002 | Rhodes | |
| 6,431,806 B1 | 8/2002 | Doche | |
| 6,435,331 B1 | 8/2002 | Olson et al. | |
| 6,439,822 B1 | 8/2002 | Kimura et al. | |
| 6,453,574 B1 | 9/2002 | Chen | |
| 6,454,515 B2 * | 9/2002 | Sato | 414/751.1 |
| 6,474,463 B1 | 11/2002 | Wolfel | |
| 6,511,065 B1 | 1/2003 | Cote et al. | |
| 6,517,304 B1 | 2/2003 | Matsumoto | |
| 6,520,726 B1 | 2/2003 | Cook et al. | |
| 6,579,052 B1 | 6/2003 | Bonora et al. | |
| 6,581,750 B1 | 6/2003 | Tweedy et al. | |
| 6,592,324 B2 * | 7/2003 | Downs et al. | 414/741 |
| 6,641,511 B2 * | 11/2003 | Patel et al. | 483/1 |
| 6,678,583 B2 | 1/2004 | Nasr et al. | |
| 6,851,913 B2 * | 2/2005 | Iizuka | 414/626 |
| 6,932,557 B2 * | 8/2005 | Downs et al. | 414/741 |
| 6,955,197 B2 | 10/2005 | Elliott et al. | |
| 6,955,517 B2 | 10/2005 | Nulman et al. | |
| 7,007,903 B2 * | 3/2006 | Turner | 248/220.21 |
| 7,051,870 B2 | 5/2006 | Schoendienst et al. | |
| 7,077,264 B2 | 7/2006 | Rice et al. | |
| 7,156,221 B2 | 1/2007 | Rice et al. | |
| 7,221,993 B2 | 5/2007 | Rice et al. | |
| 7,234,584 B2 | 6/2007 | Rice et al. | |
| 7,243,003 B2 | 7/2007 | Elliott et al. | |
| 7,258,520 B2 | 8/2007 | Elliott et al. | |
| 7,455,172 B2 | 11/2008 | Rice et al. | |
| 7,503,448 B2 | 3/2009 | Rice et al. | |
| 7,506,747 B2 | 3/2009 | Rice et al. | |
| 2002/0090282 A1 * | 7/2002 | Bachrach | 414/271 |
| 2003/0010449 A1 | 1/2003 | Gramarossa et al. | |

| | | | |
|---|---|---|---|
| 2004/0076496 A1 | 4/2004 | Elliott et al. | |
| 2004/0081546 A1 | 4/2004 | Elliott et al. | |
| 2004/0253087 A1* | 12/2004 | Iizuka | 414/626 |
| 2005/0095110 A1 | 5/2005 | Lowrance et al. | |
| 2005/0125089 A1 | 6/2005 | Puri et al. | |
| 2005/0145464 A1 | 7/2005 | Rice et al. | |
| 2005/0167554 A1 | 8/2005 | Rice et al. | |
| 2005/0232734 A1 | 10/2005 | Elliott et al. | |
| 2005/0273190 A1 | 12/2005 | Duffin et al. | |
| 2006/0016720 A1 | 1/2006 | Naito | |
| 2006/0099054 A1 | 5/2006 | Friedman et al. | |
| 2006/0182531 A1 | 8/2006 | Shah et al. | |
| 2006/0190118 A1 | 8/2006 | Teferra et al. | |
| 2007/0108019 A1 | 5/2007 | Rice et al. | |
| 2007/0108020 A1 | 5/2007 | Rice et al. | |
| 2008/0008564 A1 | 1/2008 | Bonora et al. | |
| 2008/0019810 A1 | 1/2008 | Rice et al. | |
| 2008/0031708 A1 | 2/2008 | Bonora et al. | |
| 2008/0031709 A1 | 2/2008 | Bonora et al. | |
| 2008/0219816 A1 | 9/2008 | Rice et al. | |

FOREIGN PATENT DOCUMENTS

| | | |
|---|---|---|
| EP | 0 277 536 | 8/1988 |
| EP | 0 582 019 A1 | 2/1994 |
| EP | 0663686 B1 | 6/1997 |
| EP | 0795892 A1 | 9/1997 |
| EP | 0 987 750 A1 | 3/2000 |
| EP | 1 127 815 | 8/2001 |
| EP | 1 134 641 A1 | 9/2001 |
| EP | 1450393 | 8/2004 |
| FR | 2576007 A1 * | 7/1986 |
| JP | 63020151 A2 | 1/1988 |
| JP | 63213357 A * | 9/1988 |
| JP | 02122540 A * | 5/1990 |
| JP | 04144150 A * | 5/1992 |
| JP | 05000708 A * | 1/1993 |
| JP | 05299489 A * | 11/1993 |
| JP | 10-242241 | 9/1998 |
| JP | 10-256346 | 9/1998 |
| JP | 2000-255969 | 9/2000 |
| JP | 2002-270662 | 9/2002 |
| JP | 2003-229342 | 8/2003 |
| TW | 0473655 B | 1/2002 |
| TW | 0496814 B | 8/2002 |
| TW | 0550725 B | 9/2003 |
| WO | WO 9209408 A1 * | 6/1992 |
| WO | WO 99/64207 | 12/1999 |
| WO | WO 01/13408 | 2/2001 |
| WO | WO 02/19392 A1 | 3/2002 |

OTHER PUBLICATIONS

No-Author, "Equipe Helps Streamline 300 mm Wafer Processing", Dec. 1, 1997, Manufacturing Automation, vol. 7, No. 3, p. 1-5.
No-Author, "PRI Selected by Varian Semiconductor to Supply 300mm Integrated Front-End Buffering Solutions", Feb. 10, 2000, Newswire, p. 7434.
No-Author, "300mm Single-Wafer Handling" (Brief Article), Apr. 1, 2000, Solid State Technology, vol. 43, No. 4, p. 99.
International Search Report and Written Opinion dated Jul. 3, 2008, relating to International Application No. PCT/US2008/001589.
EPC communication of Application No. 04250423.3 dated Apr. 10, 2007 citing three (3) referenced from EP Search Report.
EPC communication of Application No. 04250423.3 dated Dec. 17, 2007.
EPC communication of Application No. 04250423.3 dated Jul. 14, 2008.
EPC communication of Application No. 04250423.3 dated Nov. 19, 2008.
Taiwan Search Report of Application No. 094103762 dated Mar. 4, 2008.
Office Action of Chinese Patent Application No. 200510069730.8 issued on Nov. 9, 2007.
Office Action of Japanese Patent Application No. 2004-018830 issued on Jun. 2, 2009.
Office Action of Chinese Patent Application No. 200410035219.1 issued on Feb. 2, 2007.
Second Office Action of Chinese Patent Application No. 200510069730.8 issued on Mar. 13, 2009.
Office Action of Taiwan Patent Application No. 094103762 issued on Mar. 25, 2008.

* cited by examiner

OVERHEAD TRANSFER FLANGE AND SUPPORT FOR SUSPENDING A SUBSTRATE CARRIER

This application claims priority from U.S. provisional application Ser. No. 60/443,153, filed Jan. 27, 2003, the content of which is hereby incorporated by reference herein in its entirety.

CROSS REFERENCE TO RELATED APPLICATIONS

The present application is related to the following commonly-assigned, U.S. Patent Applications, each of which is hereby incorporated by reference herein in its entirety:

U.S. patent application Ser. No. 10/650,310, filed Aug. 28, 2003 and titled "System For Transporting Substrate Carriers", now issued as U.S. Pat. No. 7,234,584;

U.S. patent application Ser. No. 10/650,312, filed Aug. 28, 2003 and titled "Method and Apparatus for Using Substrate Carrier Movement to Actuate Substrate Carrier Door Opening/Closing", now issued as U.S. Pat. No. 7,258,520;

U.S. patent application Ser. No. 10/650,481, filed Aug. 28, 2003 and titled "Method and Apparatus for Unloading Substrate Carriers from Substrate Carrier Transport Systems", now abandoned;

U.S. patent application Ser. No. 10/650,479, filed Aug. 28, 2003 and titled "Method and Apparatus for Supplying Substrates to a Processing Tool", now abandoned;

U.S. Patent Application Ser. No. 60/407,452, filed Aug. 31, 2002 and titled "End Effector Having Mechanism For Reorienting A Wafer Carrier Between Vertical And Horizontal Orientations", now abandoned;

U.S. Patent Application Ser. No. 60/407,337, filed Aug. 31, 2002, and titled "Wafer Loading Station with Docking Grippers at Docking Stations", now abandoned;

U.S. patent application Ser. No. 10/650,311, filed Aug. 28, 2003 and titled "Substrate Carrier Door having Door Latching and Substrate Clamping Mechanism", now issued as U.S. Pat. No. 6,955,197;

U.S. patent application Ser. No. 10/650,480, filed Aug. 28, 2003 and titled "Substrate Carrier Handler That Unloads Substrate Carriers Directly From a Moving Conveyor", now issued as U.S. Pat. No. 7,243,003;

U.S. Provisional Application Ser. No. 60/443,087, filed Jan. 27, 2003 and titled "Methods and Apparatus for Transporting Wafer Carriers", now issued as U.S. Pat. No. 7,077,264;

U.S. Provisional Application Ser. No. 60/443,001, filed Jan. 27, 2003, and titled "Systems and Methods for Transporting Wafer Carriers Between Processing Tools", now issued as U.S. Pat. No. 7,221,993; and U.S. Provisional Application Ser. No. 60/443,115, filed Jan. 27, 2003, and titled "Apparatus and Method for Storing and Loading Wafer Carriers", now abandoned.

FIELD OF THE INVENTION

The present invention relates generally to semiconductor device manufacturing, and more particularly to an overhead transfer flange of a substrate carrier and a support for suspending the substrate carrier via the overhead transfer flange.

BACKGROUND OF THE INVENTION

Semiconductor devices are made on substrates, such as silicon substrates, glass plates, etc., for use in computers, monitors, and the like. These devices are made by a sequence of fabrication steps, such as thin film deposition, oxidation or nitridization, etching, polishing, and thermal and lithographic processing. Although multiple fabrication steps may be performed in a single processing station, substrates typically must be transported between processing stations for at least some of the fabrication steps.

Substrates generally are stored in cassettes or pods (hereinafter referred to collectively as "substrate carriers") for transfer between processing stations and other locations. Although substrate carriers may be carried manually between processing stations, the transfer of substrate carriers is typically automated. For instance, automatic handling of a substrate carrier may be performed by a robot, which lifts the substrate carrier by means of an end effector. As one example, end effectors have been proposed that lift a substrate carrier by engaging a flange provided at the top of the substrate carrier. One known type of end effector includes a support plate and fingers extending downwardly and inwardly from the support plate to define a "T"-shaped slot. The slot may be moved horizontally over and around the carrier flange. Pins may be provided that protrude upwardly from the end effector fingers to mate with detents provided on the flange.

Successful transport and transfer of substrate carriers requires that a substrate carrier position be controlled with a high degree of precision. It is desirable to provide a substrate carrier support and an overhead transfer flange that together facilitate proper substrate carrier positioning.

SUMMARY OF THE INVENTION

In a first aspect of the invention, a first apparatus is provided for use in supporting a substrate carrier. The first apparatus includes an overhead transfer flange adapted to couple to a substrate carrier body and an overhead carrier support. The overhead transfer flange has a first side and a second side opposite the first side that is wider than the first side.

In a second aspect of the invention, a substrate carrier is provided. The substrate carrier includes (1) a substrate carrier body adapted to support one or more substrates; and (2) an overhead transfer flange coupled to the substrate carrier body and adapted to couple to an overhead carrier support. The overhead transfer flange has a first side and a second side opposite the first side that is wider than the first side.

In a third aspect of the invention, a second apparatus is provided for use in supporting a substrate carrier. The second apparatus includes an overhead carrier support adapted to suspend a substrate carrier via an overhead transfer flange. The overhead carrier support has a first side and a second side opposite the first side that is wider than the first side. Numerous other aspects, as are methods and systems in accordance with these and other aspects of the invention.

Other features and aspects of the present invention will become more fully apparent from the following detailed description of exemplary embodiments, the appended claims and the accompanying drawings.

DETAILED DESCRIPTION

The present invention provides an overhead transfer flange for a substrate carrier and a corresponding overhead support for supporting the carrier via the overhead transfer flange. The substrate carrier may be a single substrate carrier adapted to store only one substrate or a multiple substrate carrier adapted to store a plurality of substrates. In one aspect, the overhead support is adapted such that the support provides a capture window (for capturing the overhead transfer flange) that varies from a wider window to a narrower window in a direction in which the overhead transfer flange can approach the support. In a second aspect the overhead transfer flange and overhead support are adapted such that when the overhead transfer flange is supported by the overhead support, the overhead transfer flange is prevented from moving relative to the overhead support in any direction except vertically. In a further aspect the overhead transfer flange and overhead support are adapted such that if a substrate carrier supported thereby is impacted in a direction opposite to the direction in which the carrier is traveling, the carrier's overhead transfer flange will decouple from the overhead support, allowing the carrier to fall.

Each of these aspects is considered inventive on its own, however, in at least one embodiment the overhead transfer flange and overhead support may embody each of the aspects described above. The figures and the following description thereof provide a specific configuration that embodies each of the inventive aspects identified above. The configuration of FIGS. 1-12, is merely exemplary and it will be understood that alternative configurations may be designed that function in accordance with the invention.

Figure 1:
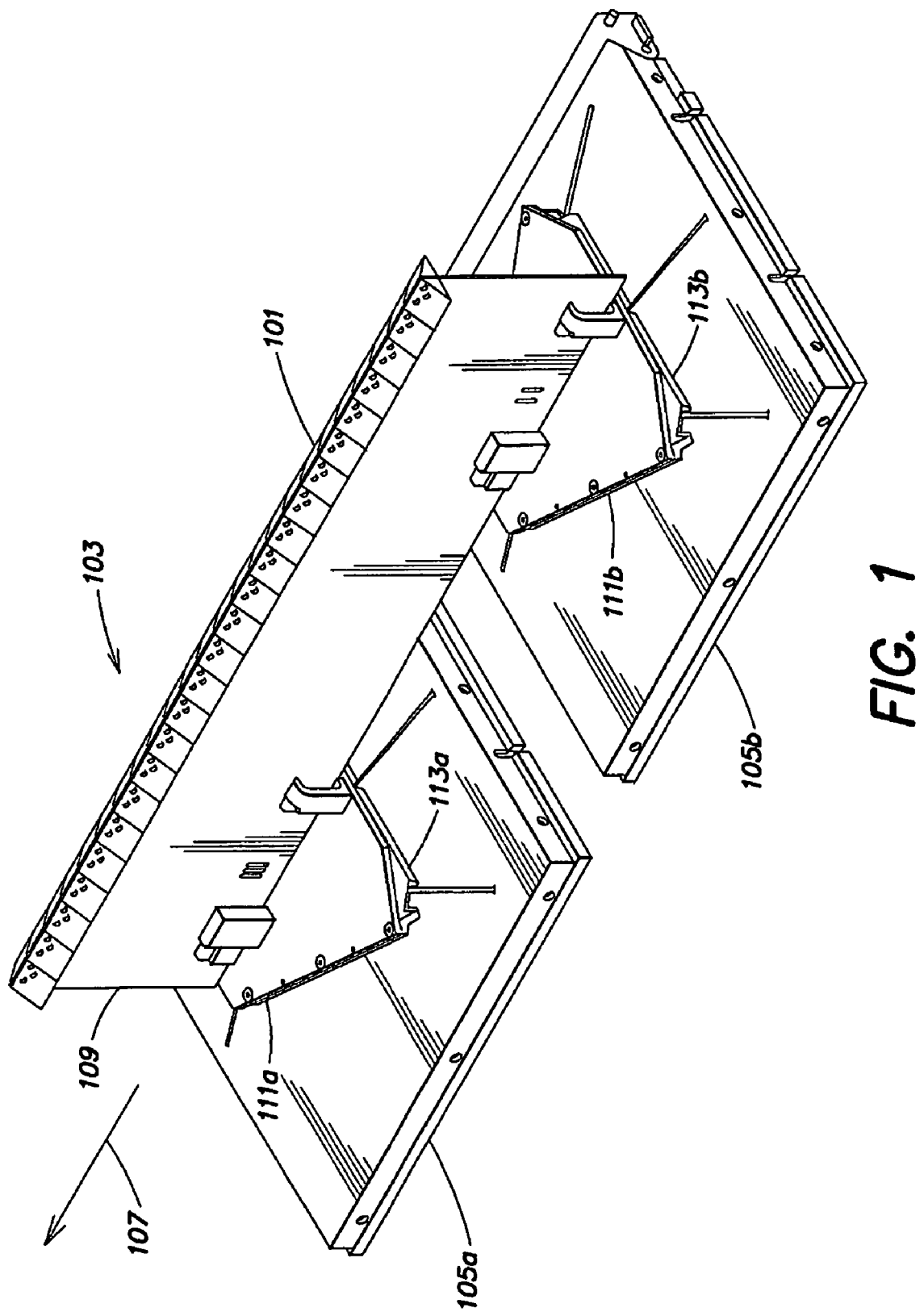
FIG. 1 is a perspective elevational view of a portion of an overhead transfer conveyor, as the overhead transfer conveyor transports a first and a second carrier.

FIG. 1 is a perspective elevational view of a portion 101 of an overhead transfer conveyor 103, as the overhead transfer conveyor 103 transports a first and a second carrier 105a, 105b in a first in-line direction 107 along a moveable track 109 of the overhead transfer conveyor 103. An inventive first overhead carrier support 111a of the overhead transfer conveyor 103 supports the first carrier 105a via an inventive first overhead transfer flange 113a fixed to and centered above the first carrier 105a, and an inventive second overhead carrier support 111b of the overhead transfer conveyor 103 supports the second carrier 105b via an inventive second overhead transfer flange 113b fixed to and centered above the second carrier 105b. Other positions of the overhead transfer flanges 113a, 113b relative to the substrate carriers 105a, 105b may be employed.

Figure 2:
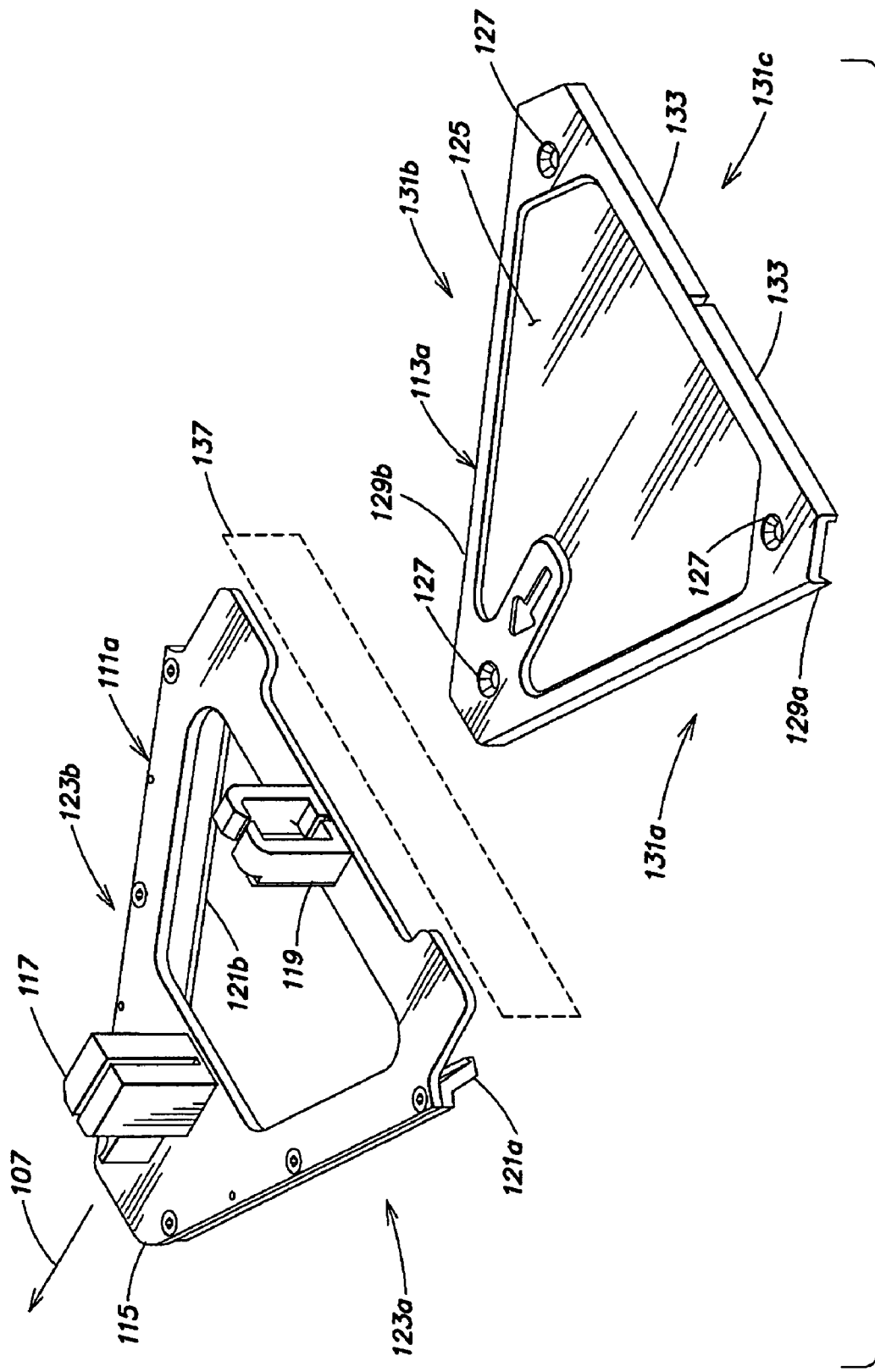
FIG. 2 is a perspective elevational view, exploded along the in-line direction, of the assembly of the overhead carrier support and the overhead transfer flange shown in FIG. 1.

FIG. 2 is a perspective elevational view, exploded along the in-line direction 107, of the assembly of the overhead carrier support 111a and the overhead transfer flange 113a shown in FIG. 1. The overhead carrier support 111a comprises a support plate 115 and a coupling clamp 117 fixed atop the support plate 115 and adapted to securely couple the overhead carrier support 111a to the moveable track 109 of the overhead transfer conveyor 103. The overhead carrier support 111a further includes a flexible hanger 119, also fixed atop the support plate 115, and adapted to provide additional support for the overhead carrier support 111a along the moveable track 109. A first blade receiver 121a is fixed below a first side 123a of the support plate 115, and a second blade receiver 121b is fixed below a second side 123b of the support plate 115, opposite the first side 123a. The various components of the overhead carrier support 111a may be coupled together using any suitable coupling mechanism (e.g., screws, bolts, adhesives, etc.). All or a portion of the components of the overhead carrier support 111a may be integrally formed.

The overhead transfer flange 113a comprises a flange plate 125 adapted to attach to a carrier (e.g., the first carrier 105a (FIG. 1)) via a suitable fastening mechanism such as fastener holes 127 or the like. A first blade 129a extends down from a first side 131a of the flange plate 125, and a second blade 129b (obscured in FIG. 2 but see FIG. 3) extends down from a second side 131b of the flange plate 125. A stiffening extension 133 extends down from a third side 131c of the flange plate 125.

As will be explained further below, the first blade receiver 121a is adapted to receive the first blade 129a, and the second blade receiver 121b is adapted to receive the second blade 129b. And as will be also explained further below, the support plate 115, the first blade receiver 121a, and the second blade receiver 121b of the overhead carrier support 111a define an overhead flange capture window 137 through which the overhead transfer flange 113a is adapted to pass prior to the first and second blade receivers 121a, 121b of the overhead carrier support 111a receiving the respective first and second blades 129a, 129b of the overhead transfer flange 113a.

Figure 3:
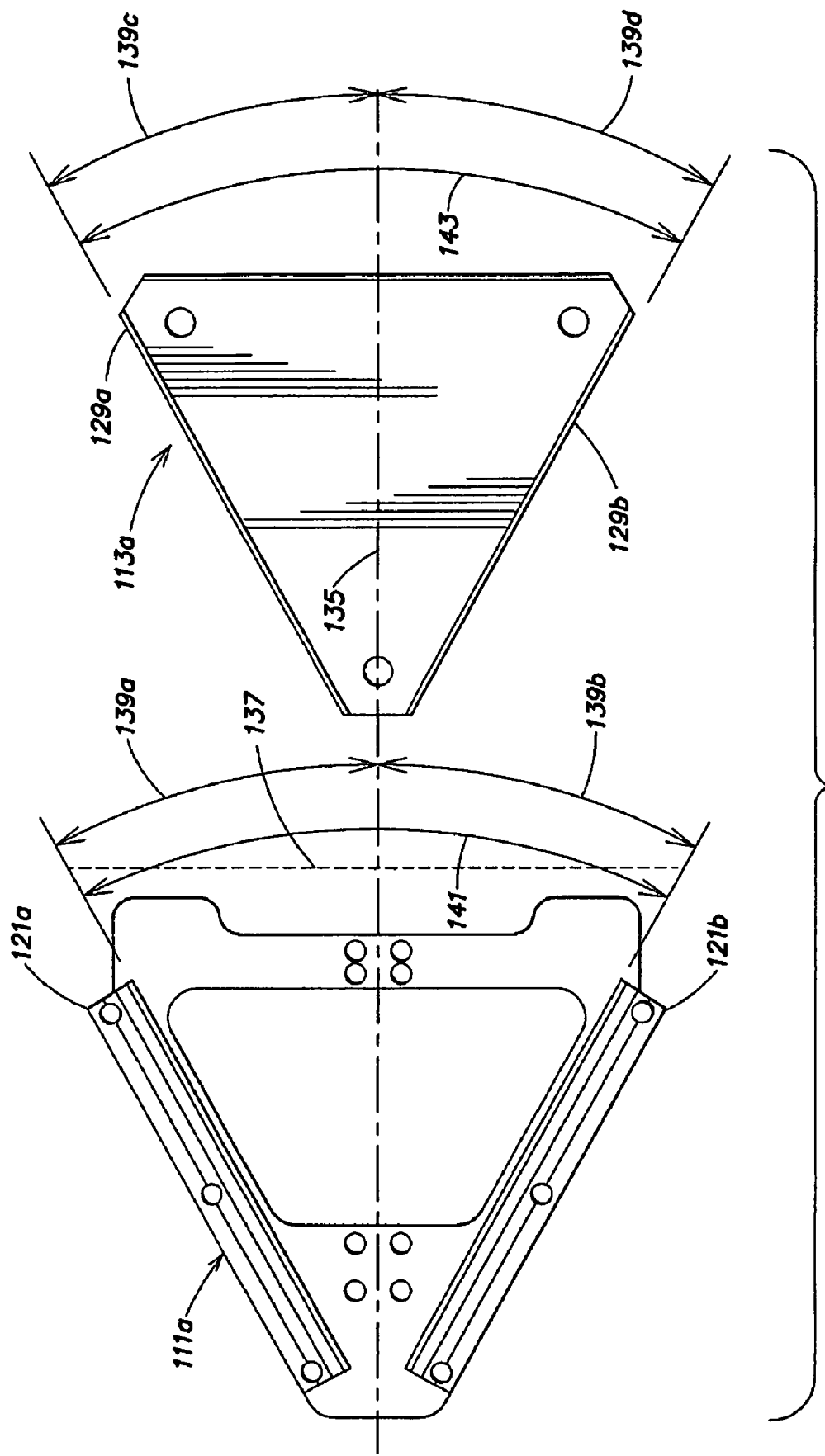
FIG. 3 is a bottom plan view, of the exploded assembly of the overhead carrier support and the overhead transfer flange shown in FIG. 2.

FIG. 3 is a bottom plan view of the exploded assembly of the overhead carrier support 111a and the overhead transfer flange 113a shown in FIG. 2. The overhead carrier support 111a and the overhead transfer flange 113a are aligned along a vertical plane 135 coinciding with a centerplane (not separately shown) of the overhead carrier support 111a and a centerplane (not separately shown) of the overhead transfer flange 113a. Referring to FIG. 1, the vertical plane 135 is preferably aligned with the vertically-oriented moveable track 109 of the overhead transfer conveyor 103, however other orientations (e.g., at an angle, or parallel but offset) can also be provided in accordance with the present invention.

The overhead flange capture window 137 appears as a line in the view of FIG. 3. The overhead carrier support 111a is adapted to permit the overhead transfer flange 113a to advance toward the overhead carrier support 111a from the relative position of the overhead transfer flange 113a shown in the view of FIG. 3 and through the overhead flange capture window 137.

The first blade receiver 121a is oriented at a first angle 139a to the centerplane (not separately shown) of the overhead carrier support 111a, and the second blade receiver 121b is oriented at a second angle 139b to the centerplane of the overhead carrier support 111a. Preferably the first angle 139a and the second angle 139b are equivalent so that the second blade receiver 121b mirrors the first blade receiver 121a from across the centerplane (not separately shown) of the overhead carrier support 111a. In one embodiment, a third angle 141 between the first blade receiver 121a and the second blade receiver 121b is about 60 degrees. Other angles may be employed (e.g., including angles as small as about 10-20 degrees). As will be apparent, the selection of the extent of the third angle 141 is related to other aspects of the geometry of the overhead carrier support 111a and the overhead transfer flange 113a, as will be explained below.

The first blade 129a is oriented at a fourth angle 139c to the centerplane (not separately shown) of the overhead transfer flange 113a, and the second blade 129b is oriented at a fifth angle 139d to the centerplane (not separately shown) of the overhead transfer flange 113a. Preferably the fourth angle 139c and the fifth angle 139d are equivalent so that the second blade 129b mirrors the first blade 129a from across the centerplane (not separately shown) of the overhead transfer flange 113a. In one embodiment, a sixth angle 143 between the first blade 129a and the second blade 129b is about 60 degrees. Other angles may be employed. For proper interaction between the overhead carrier support 111a and the overhead transfer flange 113a, the third angle 141 and the sixth angle 143 are preferably substantially equivalent.

Figure 4:
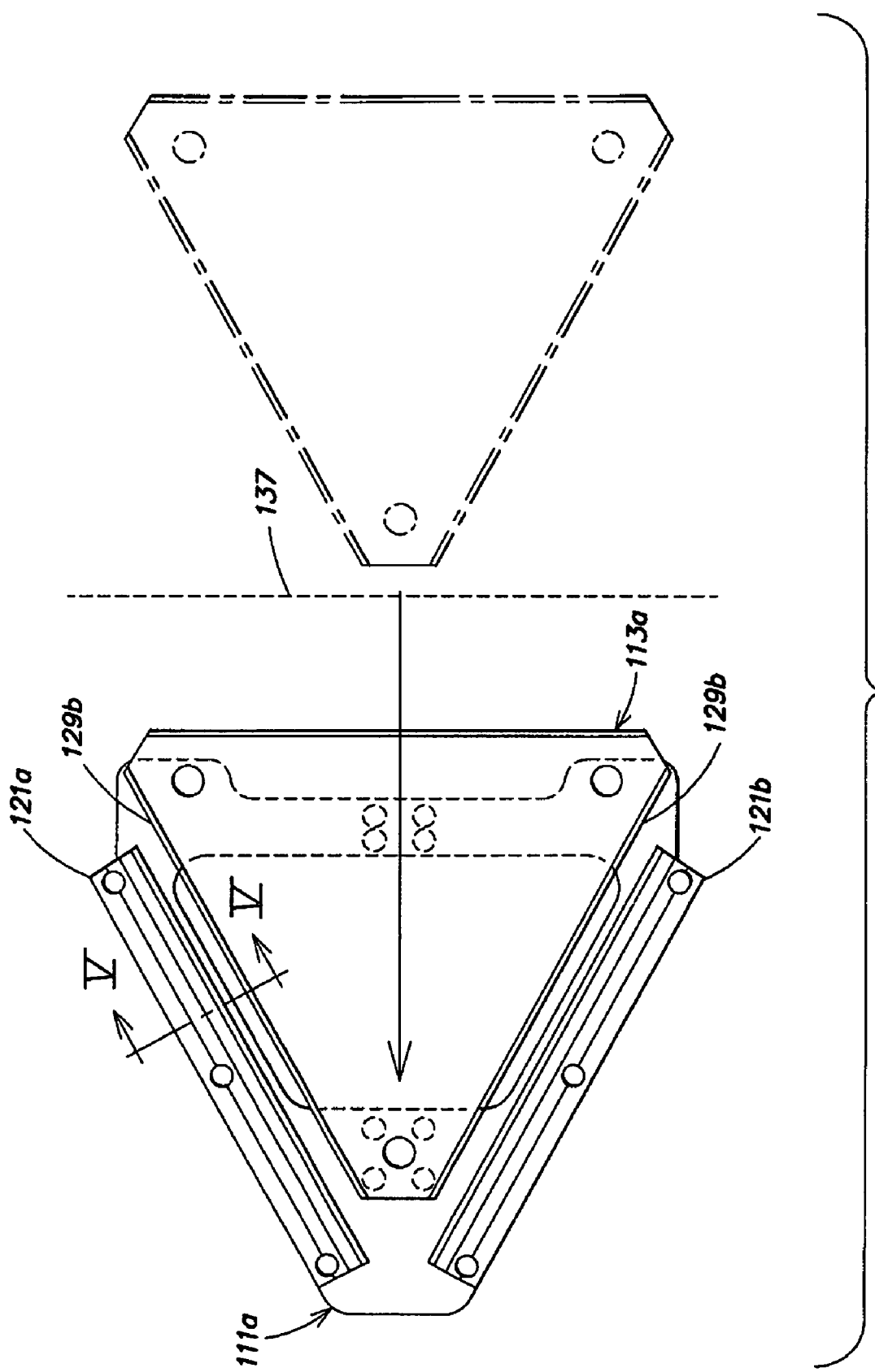
FIG. 4 is a bottom plan view of the exploded assembly of the overhead carrier support and the overhead transfer flange shown in FIG. 2.

FIG. 4 is a bottom plan view of the exploded assembly of the overhead carrier support 111a and the overhead transfer flange 113a shown in FIG. 2. FIG. 4 is similar to FIG. 3 except that the overhead transfer flange 113a has advanced from the position relative to the overhead carrier support 111a (see phantom outline) that is occupied in the view of FIG. 3, passed through the overhead flange capture window 137, and is shown in a nested position with respect to the overhead carrier support 111a. In this nested position, the first and second blades 129a, 129b, which together substantially form a cropped "V" shape or a cropped chevron, are in close spaced relation with the respective first and second blade receivers 121a, 121b (which also substantially form a cropped "V" shape or a cropped chevron), but are not yet mated with the same. This may be referred to as a staging position for the overhead transfer flange 113a.

Although advancement of the overhead transfer flange 113a through the overhead flange capture window 137 may be employed to mate the overhead transfer flange 113a with the overhead carrier support 111a, the present invention provides, and the discussion below explains, that the overhead transfer flange 113a also can be raised up from below the overhead carrier support 111a to assume the nesting position of FIG. 4 (rather than approaching with a horizontal component). A continuation of the in-line advancement similar to that shown in FIG. 4 can then take place for the first blade 129a and the second blade 129b of the overhead transfer flange 113a to respectively mate with and be securely supported by the first blade receiver 121a and the second blade receiver 121b of the overhead carrier support 111a. Section V-V as depicted in FIG. 4 is representative of the cross-sections cut normal to the first blade receiver 121a and the first blade 129a as shown and described below with reference to FIGS. 5-12.

Figure 5:
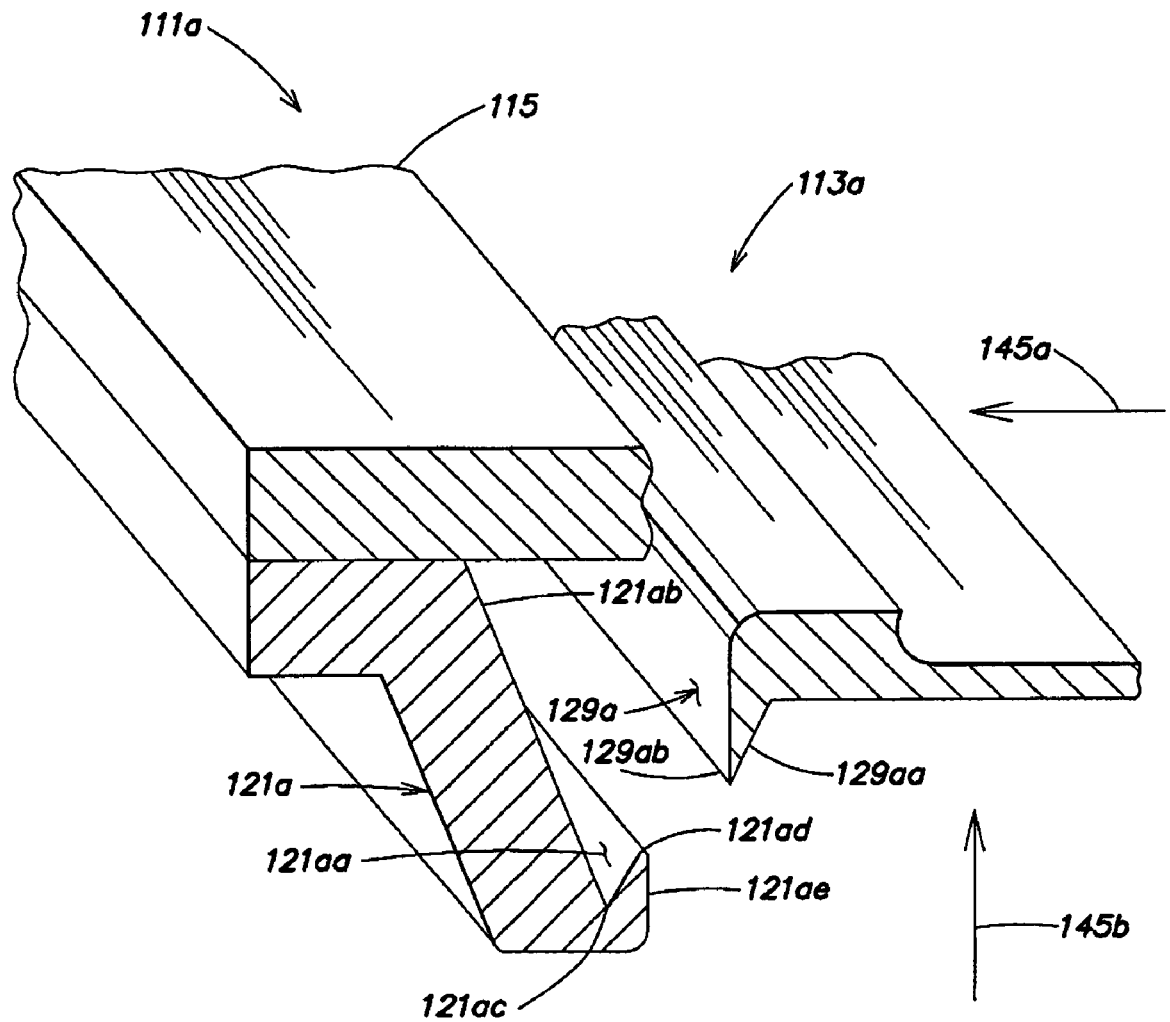
FIGS. 5 and 6 are perspective views of respective portions of the first blade receiver of the overhead carrier support, and of the first blade of the overhead transfer flange (including cross-sections)
Figure 6:
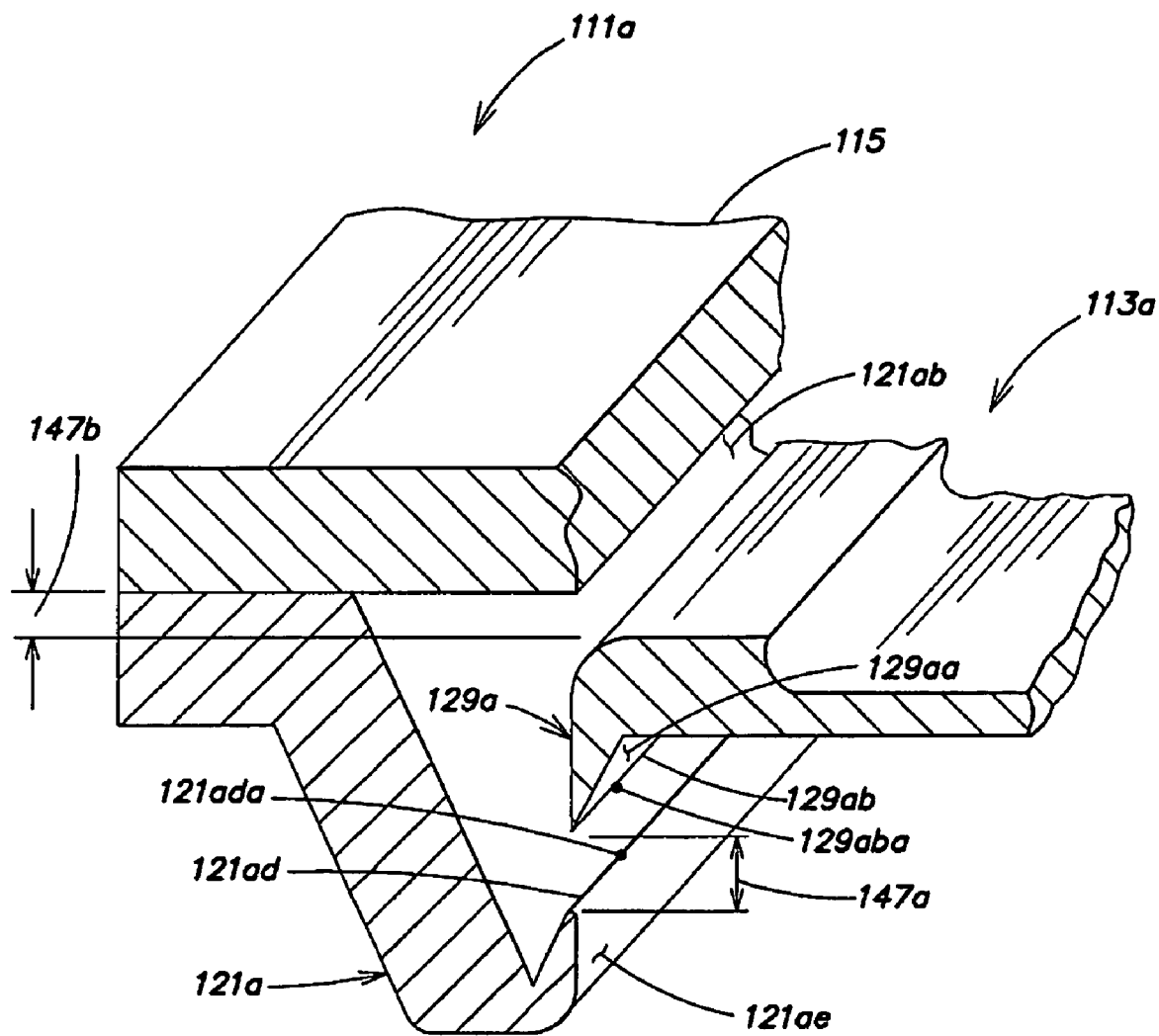
Figure 7:
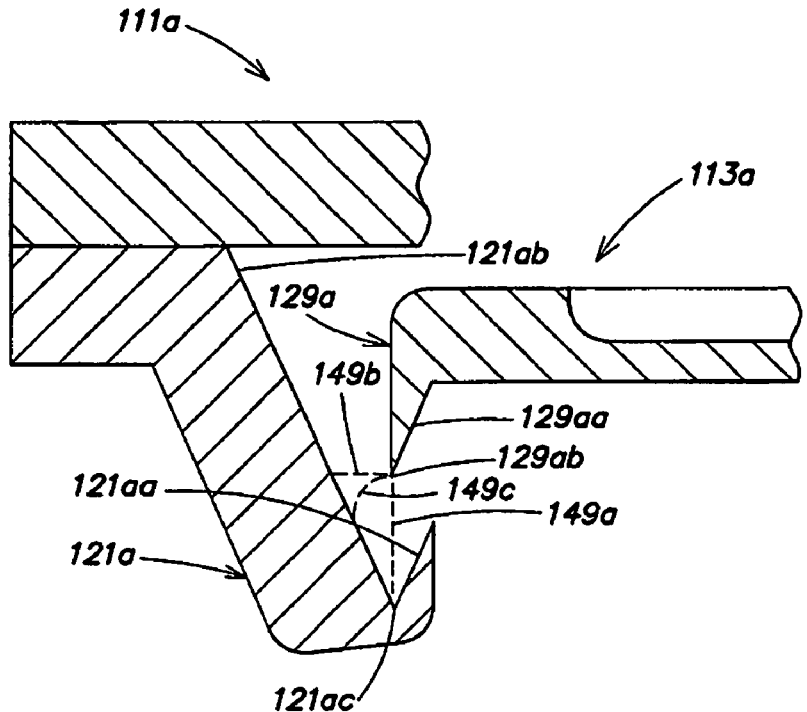
FIGS. 7-8 are simple cross-sectional views of the same portions of the overhead carrier support and the overhead transfer flange.
Figure 8:
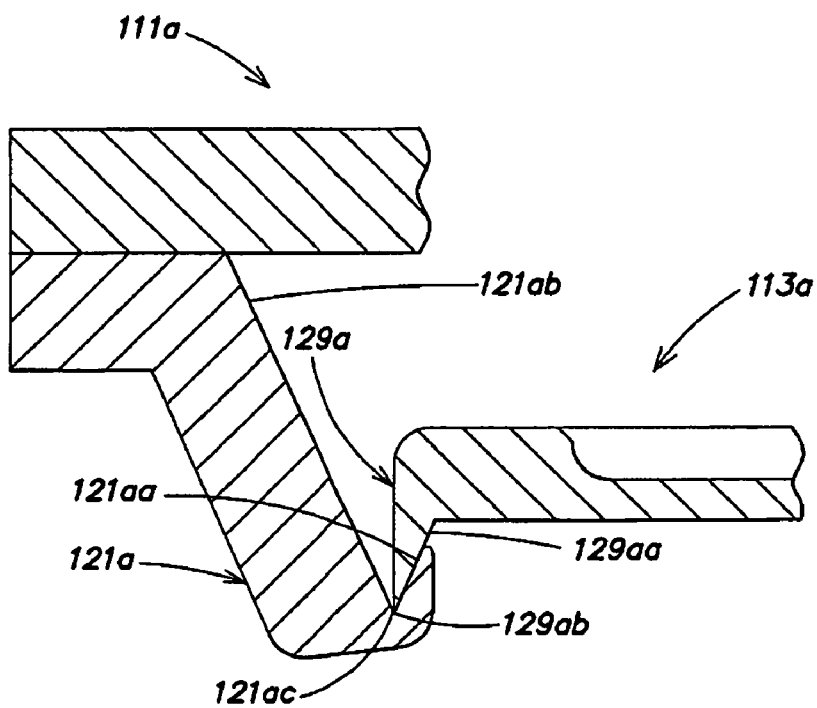

FIGS. 5 and 6 are perspective views of respective portions of the first blade receiver 121a of the overhead carrier support 111a, and of the first blade 129a of the overhead transfer flange 113a (including cross-sections), and FIGS. 7-8 are simple cross-sectional views of the same portions of the overhead carrier support 111a and the overhead transfer flange 113a. FIGS. 5-8 depict the coupling process that results in the first blade receiver 121a and the second blade receiver 121b (not shown) of the overhead carrier support 111a supporting the first blade 129a and the second blade 129b (not shown) of the overhead transfer flange 113a.

During the coupling process depicted in FIGS. 5-8, the first blade receiver 121a (shown coupled to, and below, the support plate 115 of the overhead transfer flange 113a) and the first blade 129a move relative to each other, and the second blade receiver 121b (not shown) and the second blade 129b (not shown) also move relative to each other. As between each respective pairing of blade and blade receiver, the relative motion is substantially similar, except that a relative motion between the second blade receiver 121b (not shown) and the second blade 129b (not shown) will tend to be the reverse of, or the mirror-image of, the relative motion between the first blade receiver 121a and the first blade 129a shown in FIGS. 5-8 and FIGS. 10-12. As such, FIGS. 5-8 and FIGS. 10-12 illustrate only the relative motion between the first blade receiver 121a and the first blade 129a, with the relative motion of the other blade-blade receiver pairing being understood to be the mirror image of the same.

Figure 10:
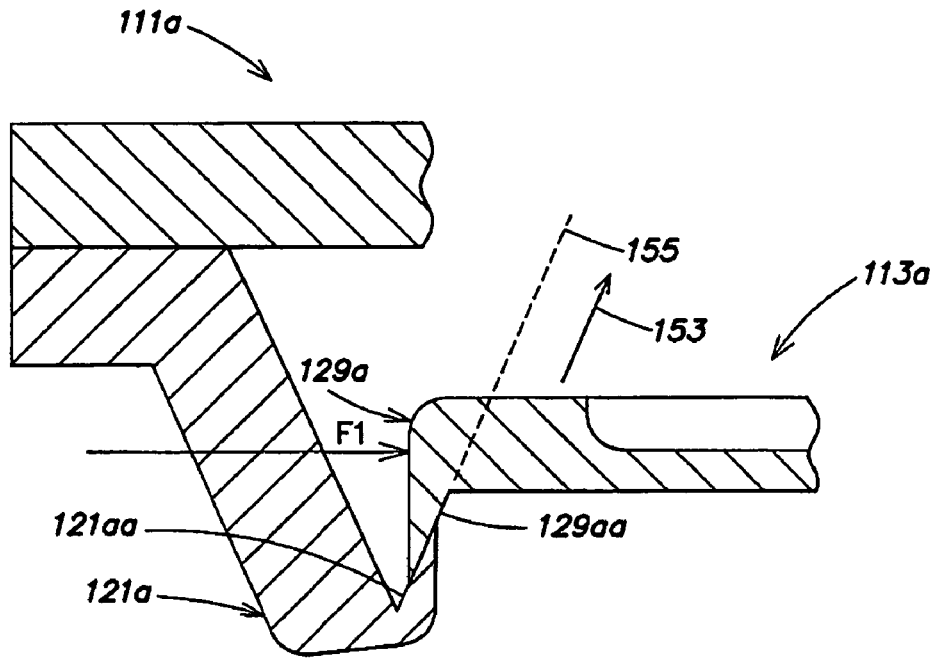
FIGS. 10-12 are cross-sectional views of respective portions of the first blade receiver of the overhead carrier support, and the first blade of the overhead transfer flange, which depict a decoupling process that results in a carrier dislodging from the overhead transfer conveyor of FIG. 1.
Figure 11:
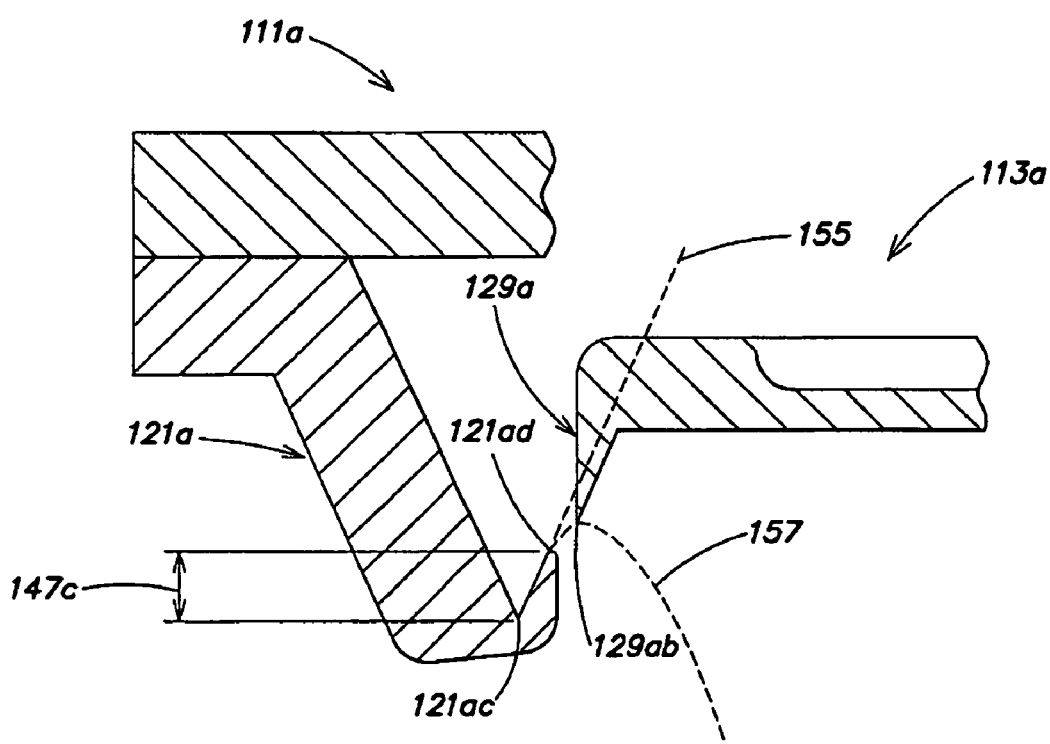
Figure 12:
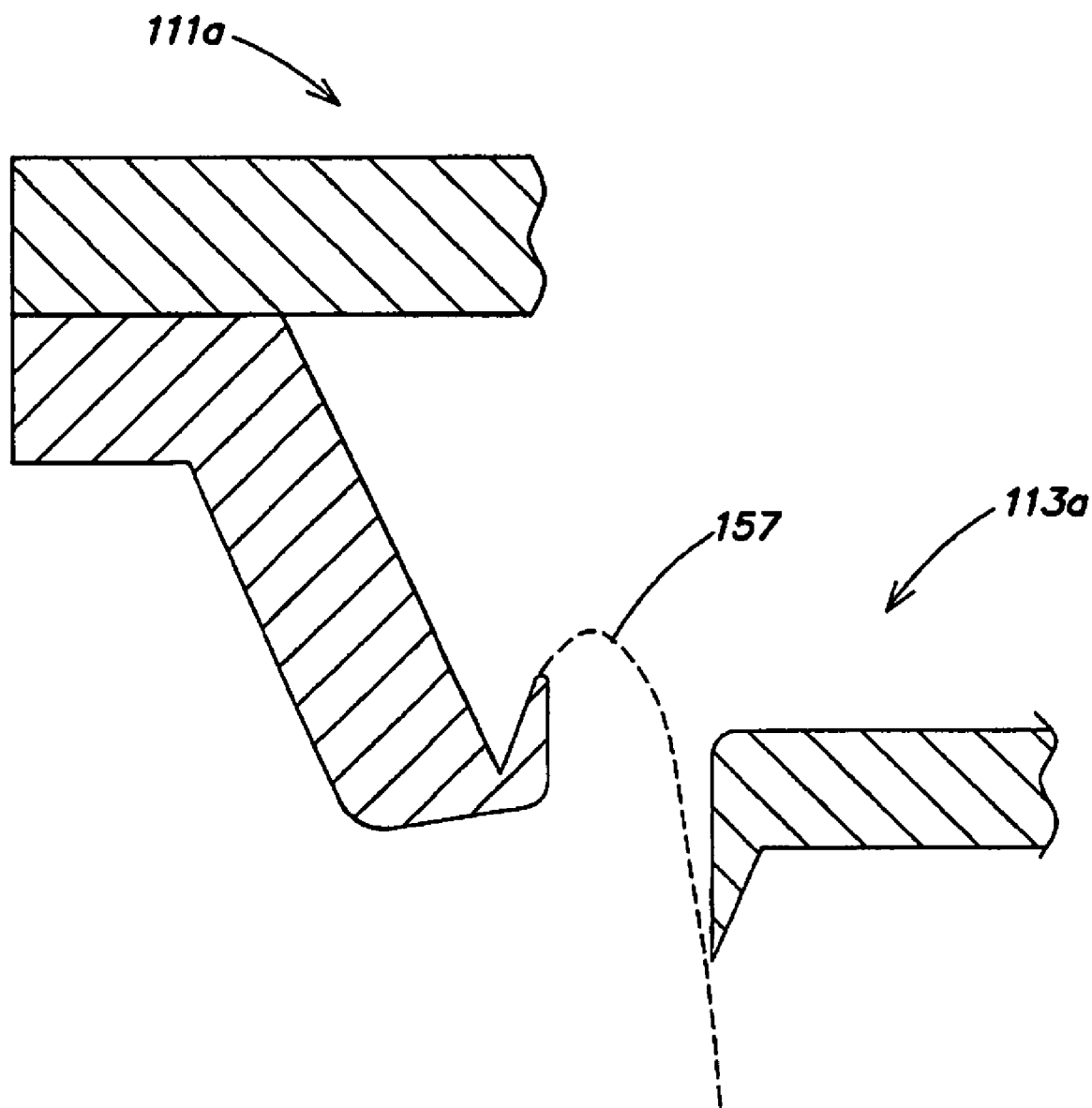

In FIGS. 5-8, as well as in FIGS. 10-12, the support plate 115 and first blade receiver 121a are shown as two pieces, coupled together. However, the support plate 115 and the first blade receiver 121a may be a single piece.

Referring to FIG. 5, a first receiving surface 121aa of the first blade receiver 121a is preferably planar, and is adapted to slidably communicate with a first blade surface 129aa (obscured) of the first blade 129a, also preferably planar, in conjunction with the first blade receiver 121a mating with the first blade 129a. A second receiving surface 121ab (obscured) of the first blade receiver 121a is also preferably planar, and is adapted to contact a first blade edge 129ab of the first blade 129a. In at least one embodiment of the invention, the first blade edge 129ab is adapted to settle into the first blade receiver 121a by the force of gravity and achieve contact with an extended vertex 121ac of the first blade receiver 121a, defined by the intersection between the first blade receiver's first receiving surface 121aa and the first blade receiver's second receiving surface 121ab. The first receiving surface 121aa of the first blade receiver 121a is also adapted to achieve contact with the first blade edge 129ab if necessary. An elongated lip 121ad of the first blade receiver 121a is preferably located at a right most extent 121ae of the first blade receiver 121a. Other locations of the lip 121ad may be employed.

The first blade 129a of the overhead transfer flange 113a is shown in FIG. 5 in a convenient staging position relative to the first blade receiver 121a of the overhead carrier support 111a as shown and described above with reference to FIG. 4, the view being that of section V-V, as indicated in FIG. 4. One reason why this staging position is convenient is because the first blade 129a is close to a lodging position within the first blade receiver 121a, requiring only to be urged toward the first blade receiver 121a in the in-line direction 107 (see FIG. 1) and lowered with respect to the first blade receiver 121a to achieve such lodging. Another reason why the staging position shown is convenient is that the first blade 129a can reach the position from multiple staging position access directions (e.g., a first staging position access direction 145a, a second staging position access direction 145b, etc.).

The first staging position access direction 145a is the horizontal access direction as shown and described with reference to FIG. 4 above. If sufficient in-line spacing exists between successive carrier supports (e.g., between the first carrier 105a and the second carrier 105b of FIG. 1) along the conveyor (e.g., the overhead transfer conveyor 103 of FIG. 1), the first staging position access direction 145a can easily be accommodated, and has the advantage of continuity and simplicity, since a simple continuation of motion of the overhead transfer flange 113a in the in-line direction 107 (see FIG. 1), past the staging position shown, is required to place the first blade 129a directly above a lodging position within the first blade receiver 121a.

The second staging position access direction 145b is a practical alternative to the first staging position access direction 145a when carriers are closely spaced along the conveyor (e.g., as closely spaced as the first carrier 105a and the second carrier 105b are along the moveable track 109 of the overhead transfer conveyor 103 as shown in FIG. 1). The second staging position access direction 145b is a vertical access direction, and it takes advantage of the fact that the chevron formed by the first blade 129a and the second blade 129b can nest closely behind the chevron formed by the first blade receiver 121a and the second blade receiver 121b without the blades coming in contact with the blade receivers 121a, 121b.

Because the chevron formed by the first blade 129a and the second blade 129b can nest behind the chevron formed by the first blade receiver 121a and the second blade receiver 121b, the overhead transfer flange 113a can rise up from below the overhead carrier support 111a and move upwards past the first blade receiver lip 121ad and past the rightmost extent 121ae of the first blade receiver 121a, such that the first blade 129a rises above the first blade receiver 121a from behind the first blade receiver 121a (e.g., behind in the in-line direction 107) to reach the convenient staging position shown in FIGS. 4 and 5. The second staging position access direction 145b has the advantage of introducing the overhead transfer flange 113a to the overhead transfer conveyor 103 at a position along the length of moveable track 109 of the overhead transfer conveyor 103 that is very close to the position at which the overhead carrier support 111a will support the overhead transfer flange 113a, so that only a minimum of in-line, lateral motion between the overhead transfer flange 113a and the overhead carrier support 111a is required to enable the overhead transfer flange 113a to lodge in the overhead carrier support 111a. For example, during raising of the overhead transfer flange 113a, a footprint of the overhead transfer flange 113a may overlap a footprint of the overhead carrier support 111a.

Referring to FIG. 6, the first blade receiver 121a, the first blade surface 129aa, and the rightmost extent 121ae of the first blade receiver 121a, all described above with reference to FIG. 5, are shown. The overhead transfer flange 113a has begun to move in the in-line direction 107 (see FIG. 4) such that relative motion between the overhead transfer flange 113a and the overhead carrier support 111a is occurring. Specifically the overhead transfer flange 113a has moved toward the overhead carrier support 111a such that the first blade edge 129ab is now directly above the first blade receiver lip 121ad, and is aligned with the rightmost extent 121ae of the first blade receiver 121a.

A first clearance 147a exists between the first blade edge 129ab of the first blade 129a and the lip 121ad of the first blade receiver 121a. In one embodiment of the invention, the first clearance 147a is preferably about 3 mm or less, and more preferably about 1.5 mm or less. Other clearances may be employed in addition, a second clearance 147b exists between the flange plate 125 (FIG. 2) of the overhead transfer flange 113a and the support plate 115 of the overhead carrier support 111a. In one embodiment of the invention, the second clearance 147b is also preferably about 3 mm or less, and more preferably about 1.5 mm or less. Other clearances may be employed. It is preferable to keep clearances such as the first clearance 147a and the second clearance 147b at a minimum since space in the clean room of a typical semiconductor device manufacturing facility can be exceptionally expensive.

It should be noted that when the overhead transfer flange 113a approaches the overhead carrier support 111a along the in-line direction 107 (see FIG. 1) the first blade 129a does not approach the first blade receiver 121a directly (e.g., parallel to the cross sections of FIG. 5) such that a particular point along the first blade 129a (e.g., point 129aba along the first blade edge 129ab of the first blade 129a, as shown in FIG. 6) will pass in a normal direction to the first blade receiver 121a and over a corresponding point (e.g., point 121ada along the first blade receiver lip 121ad, as shown in FIG. 6) on the first blade receiver lip 121ad. Rather, a combination of normal convergence between the first blade 129a and the first blade receiver 121a (e.g., the "line" of the first blade edge 129ab remains parallel with the "line" of the first blade receiver lip 121ad while advancing toward the same) and lateral, relative motion between the first blade 129a and the first blade receiver 121a (e.g., the first blade edge point 129aba moving laterally past the first blade receiver lip point 121ada) will occur as the overhead transfer flange 113a advances toward the overhead carrier support 111a in the in-line direction 107 (see FIG. 1).

As such the respective points (not separately shown) along the overhead transfer flange 113a and the overhead carrier support 111a at which the cross-sections of FIGS. 5-8 and FIGS. 10-12 are taken are not all to be presumed to be those of cross-sections V-V of FIG. 4 but should instead be presumed to change from figure to figure according to the distance between the overhead transfer flange 113a and the overhead carrier support 111a, (e.g., cross sectional views taken at points on the overhead transfer flange 113a and on the overhead carrier support 111a close to that of section V-V of FIG. 4), without necessarily affecting the manner in which the overhead transfer flange 113a and the overhead carrier support 111a are depicted therein.

Referring to FIG. 7, the overhead transfer flange 113a has moved further relative to the overhead carrier support 111a such that the first blade edge 129ab is directly above the first blade receiver's extended vertex 121ac. With the overhead transfer flange 113a in this position relative the overhead carrier support 111a, the first blade 129a can be allowed to drop relative to the first blade receiver 121a along a vertical path 149a such that the first blade edge 129ab can achieve linear contact with the first blade receiver's extended vertex 121ac.

Alternatively, the first blade 129a can be urged further toward the first blade receiver 121a along a horizontal path 149b in the same horizontal plane, resulting in linear contact between the first blade edge 129ab and the first blade receiver's second receiving surface 121ab. As yet another alternative, the first blade 129a can be moved through a sloping path 149c having both horizontal and vertical components to achieve a similar result as that achieved via the sloping path 149c. The sloping path 149c in particular can be achieved by allowing the overhead transfer flange 113a to lower or drop onto the overhead carrier support 111a after the contribution of an initial horizontal velocity component.

As an example, the overhead transfer flange 113a (e.g., the first carrier 105a of which the overhead transfer flange 113 is a part) can be propelled horizontally at the same speed as the moveable track 109 of the overhead transfer conveyor 103 (e.g., by an arrangement of motorized rollers providing a horizontal conveying surface or by any other means). The horizontal speed of the first carrier 105 may be increased, causing the overhead transfer flange 113a to "close" with the overhead carrier support 111a and the first carrier 105a (and the overhead transfer flange 113a attached thereto) may be lowered or dropped relative to the overhead carrier support 111a.

A curved path similar to the sloping path 149c can begin when the lateral position of the overhead transfer flange 113a relative to the overhead carrier support 111a is as shown in FIG. 6, or even before the first blade edge 129ab clears the first blade receiver lip 121ad, as shown in FIG. 5, provided the overhead transfer flange 113a passes over the first blade receiver lip 121ad without striking the first blade receiver lip 121ad, and contacts the first blade receiver's first receiving surface 121aa, the first blade receiver's second receiving surface 121ab, or the first blade receiver's extended vertex 121ac.

Referring to FIG. 8, the overhead transfer flange 113a is shown supported by the first blade receiver 121a, with the first blade 129a being lodged within the overhead carrier support 111a. The first blade edge 129ab is in linear contact with the first blade receiver's extended vertex 121ac, and the first blade 129a is in planar contact with the first blade receiver's first receiving surface 121aa.

As an example, just prior to the first blade edge 129ab achieving linear contact with the first blade receiver's extended vertex 121ac, the first blade 129a may have slid downward and rightward, with the first blade edge 129ab sliding atop and in linear contact with the first blade receiver's second receiving surface 121ab. In one embodiment of the invention, the first blade receiver's second receiving surface 121ab is preferably oriented at about a 25-degree to a 30-degree angle to the vertical plane. Such an inclination ensures that the first blade 129a will travel expeditiously downward from the point of contact of the first blade edge 129ab with the first blade receiver's second receiving surface 121ab. Other angles may be employed.

Alternatively, the first blade 129a may have slid downward and leftward, with the first blade surface 129aa sliding atop and in planar contact with the first blade receiver's first receiving surface 121aa. In at least one embodiment of the invention, the first blade receiver's first receiving surface 121aa is preferably oriented at about a 25-degree to a 30-degree angle to the vertical plane. Other angles may be employed.

While the first blade 129a is seated within the first blade receiver 121a (and the second blade 129b is seated within the second blade receiver 121b (see FIGS. 4-5)), the overhead transfer flange 113a is advantageously restricted in both lateral directions and in the rearward direction (e.g., opposite the in-line direction 107 (see FIG. 1)) by the obstacle to the first blade surface 129aa posed by the first blade receiver's first receiving surface 121aa. In at least one embodiment of the invention, the blade and receiving surfaces are preferably flat and have complementary orientations with regard to the vertical to ensure close mating communication between the first blade surface 129aa and the first blade receiver's first receiving surface 121aa. As previously noted, the second blade receiver restricts lateral motion in the same manner. Non-flat surfaces also may be employed.

At the same time the overhead transfer flange 113a is advantageously restricted in the forward direction (e.g., the in-line direction 107 (See FIG. 1)) by the obstacle to the first blade edge 129ab posed by the first blade receiver's second receiving surface 121ab. The first blade edge 129ab may be somewhat rounded (e.g., a sharp corner that is broken, a radiused edge, a truncated cone, etc.) to ensure smooth sliding between the first blade edge 129ab and the first blade receiver's second receiving surface 121ab whenever the first blade edge 129ab and the first blade receiver's second receiving surface 121ab are caused to slidably communicate.

It should be noted, however, that communication between the first blade edge 129ab and the first blade receiver's second receiving surface 121ab is expected to occur almost exclusively during the process of depositing the overhead transfer flange 113a upon the overhead carrier support 111a. That is, once the first blade edge 129ab is lodged within the first blade receiver's extended vertex 121ac, and the first carrier 105a (see FIG. 1) is being transported in the in-line direction 107 by the overhead transfer conveyor 103, there may be relatively little likelihood of the first carrier 105a being subjected to a force tending to urge the overhead transfer flange 113a forward relative the overhead carrier support 111a. As will be explained further below, and with reference to FIGS. 9-12, it is more likely that the overhead transfer flange 113a will be subjected to forces tending to urge it laterally, or forces tending to urge it rearwardly, or a combination of such forces.

Figure 9:
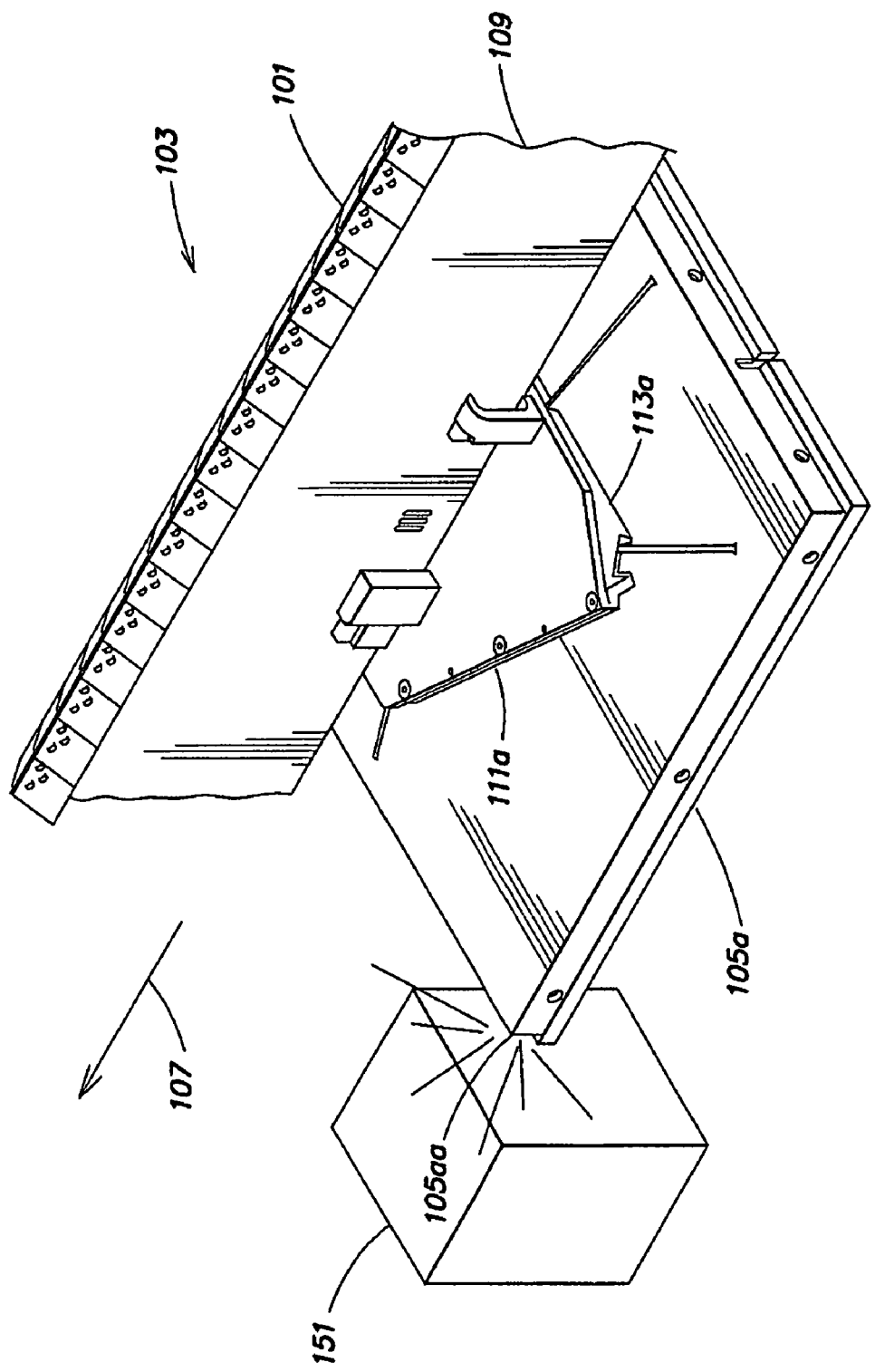
FIG. 9 is a perspective cut-away view of a portion of the overhead transfer conveyor of FIG. 1 utilizing the inventive coupling between the overhead carrier support and the overhead transfer flange, wherein an object, present in the path through which the overhead transfer conveyor carries a carrier, strikes the carrier.

FIG. 9 is a perspective cut-away view of a portion of the overhead transfer conveyor 103 utilizing the inventive coupling between the overhead carrier support 111a and the overhead transfer flange 113a to carry the first carrier 105a in the in-line direction 107. An object 151, present in the path through which the overhead transfer conveyor 103 carries the first carrier 105a, strikes a corner 105aa of the first carrier 105a. The object 151 may be a piece of machinery such as a robot that has moved away from its intended path due to a programming error, misplaced equipment or any other object. Many other objects or items may be placed, either intentionally or unintentionally, in positions near the overhead transfer conveyor 103 such that a collision with the first carrier 105a may take place at the first carrier corner 105aa.

Collisions with the first carrier 105a may also be caused by objects (not separately shown) striking the bottom, side, top or rear of the first carrier 105a. It would be unexpected for an object to strike the first carrier 105a from behind, since the moveable track 109 of the overhead transfer conveyor 103 preferably carries substrate carriers at a high rate of speed in the in-line direction 107.

An advantage of the overhead carrier support 111a and the overhead transfer flange 113a of the present invention is that the first carrier 105a can predictably and controllably dislodge from the overhead transfer conveyor 103 when subjected to a rearward or lateral force of a predetermined amount, such as, for example, 3 pounds or more, or preferably 5 pounds or more. That is, in one embodiment of the invention, if the first carrier 105a is struck by a force of 1 or 2 pounds, directed toward the first carrier 105a from the front or side, the overhead transfer flange 113a preferably remains within the overhead carrier support 111a so that the first carrier 105a continues to be carried by the overhead transfer conveyor 103 in the in-line direction 107. However, if the first carrier 105a is struck by a force of 7 or 8 pounds, directed toward the first carrier 105a from the front or side, the overhead transfer flange 113a preferably dislodges from the overhead carrier support 111a and falls downward away from the overhead transfer conveyor 103 and away from the other substrate carriers being carried by the overhead transfer conveyor 103.

As described above and with respect to FIG. 1, when the first carrier 105a is being carried by the overhead transfer conveyor 103 along the moveable track 109 in the in-line direction 107, lateral relative movement, front-to-rear relative movement, and rear-to-front relative movement on the part of the overhead transfer flange 113a relative to the overhead carrier support 111a is restricted, and in the normal operation of the overhead transfer conveyor 103, such movement is essentially prevented. Downward movement of the overhead transfer flange 113a relative to the overhead carrier support 111a is similarly restricted. Upward motion of the overhead transfer flange 113a relative to the overhead carrier support 111a however is generally unrestricted.

The object 151 depicted in FIG. 9 is likely to subject the first carrier 105a to lateral and rearward forces which will vary depending on the speed of the overhead transfer conveyor 103 in the in-line direction 107, the angle at which the first carrier 105a strikes the object 151, and the width of the first carrier 105a (e.g., the distance from the moveable track 109 at which the collision between the object 151 and the first carrier 105a takes place). The overhead carrier support 111a, however, preferably restricts twisting and translating motion of the overhead transfer flange 113a in the horizontal plane. As such, in order to prevent damage to the moveable track 109 of the overhead transfer conveyor 103, the horizontal forces resulting from the collision should be somehow redirected.

As viewed from the front of the overhead transfer flange 113a in the in-line direction 107, the first blade receiver's first receiving surface 121aa (FIG. 5) tilts backward, and the horizontally cropped chevron formed by the first blade receiver's first receiving surface 121aa and its counterpart surface (not shown) on the second blade receiver 121b (see FIG. 2) increases from a narrow aspect near the front of the overhead transfer flange 113a to a wider aspect near the rear of the overhead transfer flange 113a. This combination of two backward-tilting surfaces forming a rear-outward tapering chevron provides that the mating surface (e.g., the first blade surface 129aa and its counterpart surfaces (not shown) on the second blade 129b (see FIG. 2) may "ride" upward and rearward with regard to the overhead transfer flange 113a, sliding along and in mating communication with their corresponding support surfaces as they ride.

In operation, the chevron-shaped arrangement of rearward and upward tilting surfaces just described, cooperates with rearward and lateral impact forces to which the first carrier 105a may be subjected (e.g., during a collision) to cause the overhead transfer flange 113a of the first carrier 105a to move upward and rearward relative to the overhead carrier support 111a of the overhead transfer conveyor 103. The overhead transfer flange 113a may dislodge from the overhead carrier support 111a, and thereby cause the first carrier 105a to fall from the overhead transfer conveyor 103. This cooperation is explained below and with reference to FIGS. 10-12.

FIGS. 10-12 are cross-sectional views of respective portions of the first blade receiver 121a of the overhead carrier support 111a, and the first blade 129a of the overhead transfer flange 113a, which views depict the decoupling process that results in the first carrier 105a dislodging from the overhead transfer conveyor 103. Referring to FIG. 10, the force F1 is applied to the overhead transfer flange 113a normal to the direction in which the first blade 129a extends as shown in FIGS. 5 and 6, and is a force derived from an impact between the first carrier 105a and the object 151 as shown in FIG. 10.

If not for the obstacle posed by the first blade receiver's first receiving surface 121aa to the lateral motion of the first blade 129a of the overhead transfer flange 113a, the force F1 would urge the first blade 129a away from the first blade receiver 121a in a lateral direction within the horizontal plane in which the overhead transfer flange 113a is shown to reside in FIG. 8. However, because the first blade receiver's first receiving surface 121aa blocks direct lateral movement of the overhead transfer flange 113a due to the planar communication between the first blade receiver's first receiving surface 121aa and the first blade surface 129aa, the overhead transfer flange 113a reacts to the force F1 by the first blade surface 129aa sliding or "riding" upwards and rearward with respect to the overhead carrier support 111a as a whole.

As described above, rearward motion of the overhead transfer flange 113a relative to the overhead carrier support 111a means that the point (not shown) on the overhead transfer flange 113a at which the cross section of FIG. 10 is taken, moves into the page as the first blade surface 129aa slides upward along the first blade receiver's first receiving surface 121aa, and that cross-sections of the overhead transfer flange 113a in FIGS. 10-12 are taken at different points of the overhead transfer flange 113a.

Referring again to FIG. 10, in response to the force F1, the first blade surface 129aa of the first blade 129a rides up the first blade receiver's first receiving surface 121aa of the overhead carrier support 111a in direction 153, which is aligned with the slope 155 of the first blade receiver's first receiving surface 121aa. Because the first blade surface 129aa of the overhead transfer flange 113a and the first blade receiver's first receiving surface 121aa are in planar communication, and because complementary surfaces (not shown) on the other side of the overhead transfer flange 113a operate at the same time, the overhead transfer flange 113a can tend to retain, as it rises, the horizontal orientation it assumed while being carried by the overhead carrier support 111a along the overhead transfer conveyor 103 (see FIG. 8) prior to the impact between the first carrier 105a and the object 151 (see FIG. 9). In addition, the above-described arrangement of cooperating surfaces may cause the centerplane (not shown) of the overhead transfer flange 113a to remain roughly aligned with the moveable track 109 of the overhead transfer conveyor 103 as the overhead transfer flange 113a rises and moves rearward relative to the overhead carrier support 111a.

Referring to FIG. 11, the overhead transfer flange 113a has been fully dislodged from the overhead carrier support 111a and is in upward projectile motion, as shown by projectile motion path 157, departing from the slope 155 of the first blade receiver's first receiving surface 121aa. The overhead transfer flange 113a is now no longer restricted in its vertical motion and may pass downward and away from the overhead carrier support 111a.

The overhead transfer flange 113a is shown in FIG. 11 to have risen such that the first blade edge 129ab has at least achieved a clearance 147c with respect to the first blade receiver's extended vertex 121ac, which coincides with the height of the first blade receiver lip 121ad above the first blade receiver extended vertex 121ac. As such, the first blade edge 129ab can pass above the first blade receiver lip 121ad without risk of the first blade 129a striking the first blade receiver 121a. The clearance 147c is preferably about 3 mm, it being noted that the extent of the clearance 147c is to be selected based in part on the desired breakaway force, which in this embodiment is about 5 pounds, as described above. Should the desired breakaway force be less than 5 pounds, a lesser clearance 147c may be selected, and vice-versa. For example, in another embodiment of the invention, a force of up to 20 pounds may be required to dislodge the first carrier 105a from the overhead transfer conveyor 103. In such embodiments, a larger clearance 147c may be desired (e.g., about 0.5 inches in one embodiment).

Referring to FIG. 12, the overhead transfer flange 113a has passed rearward, downward and away from the overhead carrier support 111a, with the progression of points on the first blade edge 129ab describing the remainder of the projectile motion path 157. The first carrier 105a (see FIG. 9) may now be caught in a net or other similar mechanism for gentle collection of the first carrier 105a after the impact with the object 151 (see FIG. 9).

The foregoing description discloses only exemplary embodiments of the invention; modifications of the above disclosed apparatus and methods which fall within the scope of the invention will be readily apparent to those of ordinary skill in the art. For instance, the overhead carrier support 111a and the overhead transfer flange 113a may be formed from any suitable material (e.g., materials that slide freely and exhibit long term wear resistance). Exemplary materials for the overhead carrier support and/or the overhead transfer flange include metals (e.g., stainless steel, aluminum, etc.), plastics (e.g., polycarbonate, polyethelene, other ultra high molecular weight or high density plastics, nylon, PTFE, etc.), or other similar materials. Plastic components may be molded or otherwise fabricated.

Figure 13:
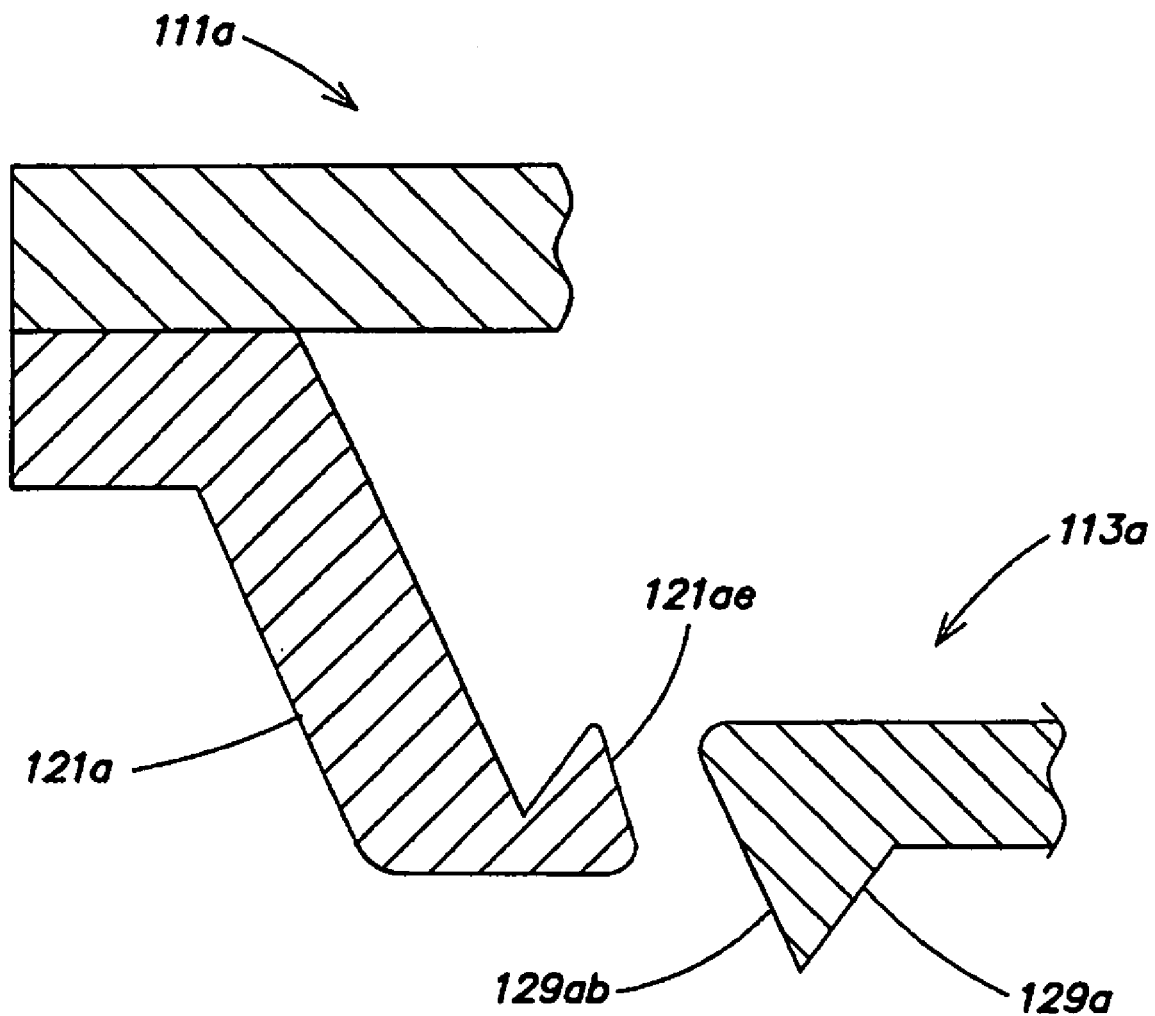
FIG. 13 is a cross sectional view of a portion of the first blade receiver of the overhead carrier support and of the first blade of the overhead transfer flange illustrating an alternative embodiment of such components.

FIG. 13 is a cross sectional view of a portion of the first blade receiver 121a of the overhead carrier support 111a and of the first blade 129a of the overhead transfer flange 113a illustrating an alternative embodiment of such components. With reference to FIG. 13, both the right most extent 121ae of the first blade receiver 121a and the first blade edge 129ab of the first blade 129a are angled at about 45 degrees from vertical (although other angles may be employed). Such a configuration provides a larger capture window for the overhead transfer flange 113a than when the right most extent 121ae and the first blade edge 129ab are not angled. Also, when angled, these surfaces may slide relative to one another when misaligned and may assist in capture of the overhead transfer flange 113a by the overhead carrier support 111a.

While the overhead carrier support 111a and the overhead transfer flange 113a have been described herein primarily for use with overhead transport systems, it will be understood that the overhead carrier support 111a (or portions thereof) may be employed to support and/or position a substrate carrier having the overhead transfer flange 113a at any other location. For example, the overhead carrier support 111a (or portions thereof) may be used for supporting and/or positioning substrate carriers within stockers, substrate carrier cleaners, local storage buffers that are part of a processing tool, batch process tools such as a furnace or a wet clean station, etc.

Figure 14:
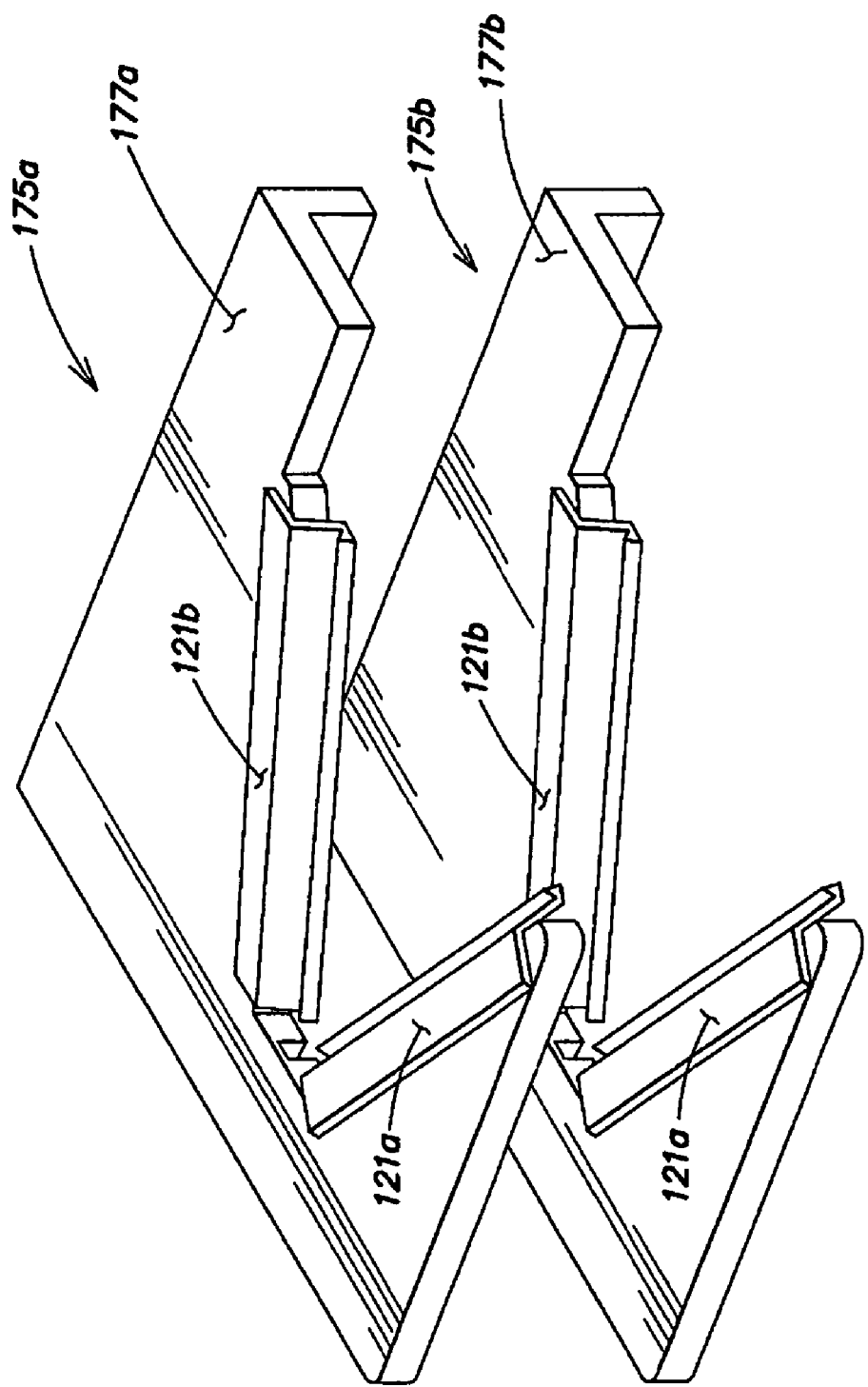
FIG. 14 is a perspective view of a plurality of shelves configured to support substrate carriers via an overhead transfer flange in accordance with the present invention.

FIG. 14 is a perspective view of a plurality of shelves 175a-b configured to support substrate carriers via an overhead transfer flange in accordance with the present invention. More or fewer than two shelves may be employed. Each shelf 175a-b includes a support surface 177a-b having blade receivers 121a, 121b coupled thereto (or formed therein). The shelves 177a-b thus forms overhead carrier supports that may support substrate carriers having overhead transfer flanges such as the overhead transfer flange 113a (FIGS. 1-12). The angles/dimensions of the blade receivers 121a, 121b may be, for example, similar to those described previously. The shelves 177a-b may be mounted at any location at which a substrate carrier is to be supported (e.g., within stockers, substrate carrier cleaners, local storage buffers that are part of a processing tool, batch process tools, etc.). In one or more embodiments of the invention, the shelf 175a and/or 175b may be moveable. For example, the shelf 175a and/or 175b may be used to dock or undock a substrate carrier to/from a loadport of a processing tool.

Figure 15:
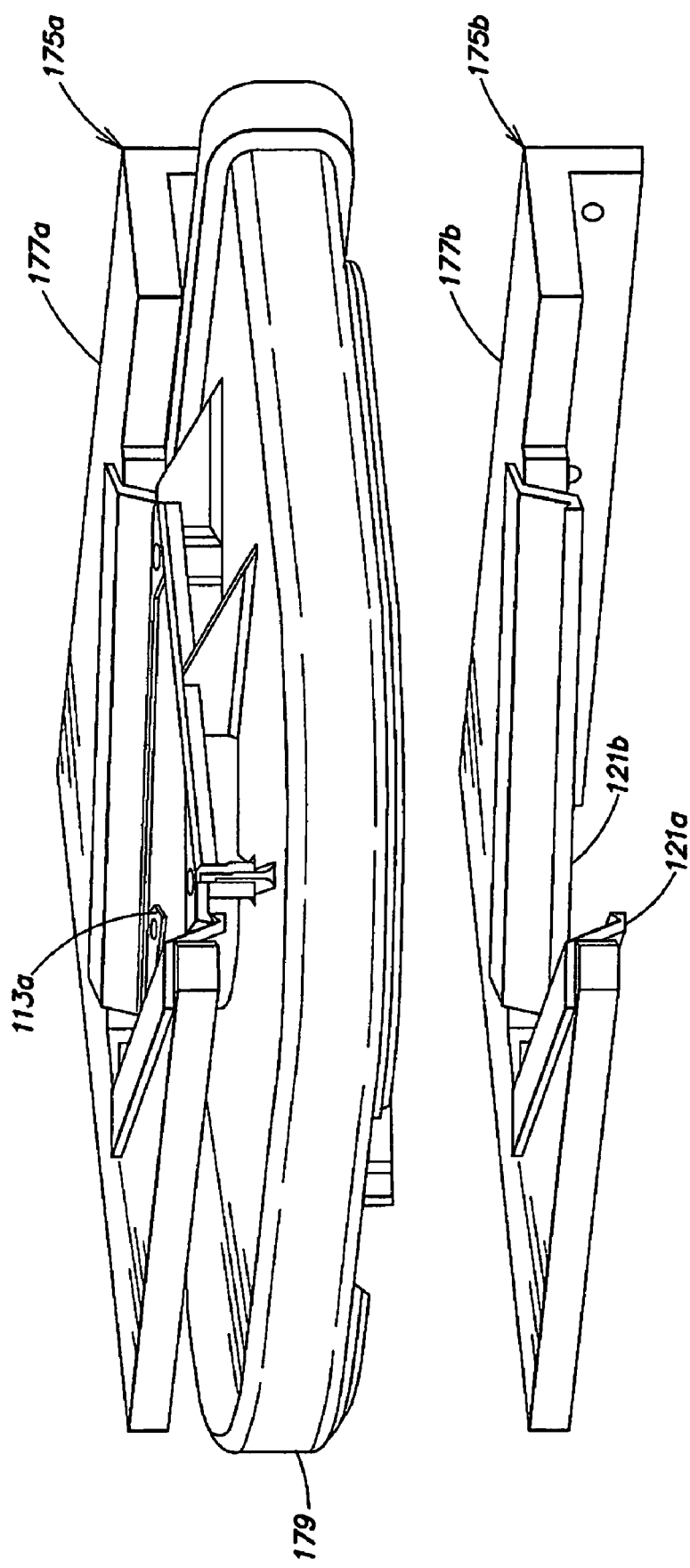
FIG. 15 is a perspective view of the shelves of FIG. 14 wherein the top shelf supports a substrate carrier via its overhead transfer flange.

FIG. 15 is a perspective view of the shelves 175a-b of FIG. 14 wherein the top shelf 175a supports a substrate carrier 179 via its overhead transfer flange 113a. The substrate carrier 179 may be a single substrate carrier or adapted to house multiple substrate carriers. As will be apparent, use of the blade receivers 121a, 121b and the overhead transfer flange 113a allows substrate carriers to be stacked with a high packing density and stored on and removed from storage shelves with relatively few movements.

The overhead transfer flange 113a may be employed with open substrate containers or trays. The blade receivers of an overhead carrier support may be angled from front to back of the overhead carrier support (relative to horizontal); and/or the blade edges of an overhead transfer flange may be angled from front to back of the overhead transfer flange (relative to horizontal).

Accordingly, while the present invention has been disclosed in connection with exemplary embodiments thereof, it should be understood that other embodiments may fall within the spirit and scope of the invention, as defined by the following claims.

The invention claimed is:

1. An apparatus for use in supporting a substrate carrier comprising:
    an overhead transfer flange adapted to couple to a substrate carrier body and an overhead carrier support of an overhead transfer conveyor, the overhead transfer flange having:
        a flange plate adapted to couple to the substrate carrier;
        a first side;
        a second side opposite the first side that is wider than the first side;
        a third side extending from the first side to the second side and including a blade adapted to engage supporting features of the overhead carrier support; and
        a fourth side opposite the third side extending from the first side to the second side and including a blade adapted to engage supporting features of the overhead carrier support;
    wherein the blades of the third side and the fourth side of the overhead transfer flange extend from the first side to the second side along non-parallel paths and wherein a medial surface of each blade forms an oblique angle with a plane defined by the first, second, third and fourth sides of the transfer flange and wherein the blades of the third side and the fourth side extend down from lower surfaces of the flange plate located adjacent to, and between the blades, and the blades include a blade edge terminating below the lower surfaces.

2. The apparatus of claim 1 wherein the third side and the fourth side are separated by an angle of about 60 degrees.

3. The apparatus of claim 1 wherein each blade has a blunted blade edge.

4. The apparatus of claim 3 wherein each blade has a radiused blade edge.

5. The apparatus of claim 1 wherein:
    the blade of the third side of the overhead transfer flange has a surface that is angled so as to mate with an angled surface of a first supporting feature of the overhead carrier support; and the blade of the fourth side of the overhead transfer flange has a surface that is angled so as to mate with an angled surface of a second supporting feature of the overhead carrier support.

6. The apparatus of claim 1 wherein surfaces forming each respective blade are non-parallel to each other.

* * * * *